US005245126A

United States Patent [19]

Saito et al.

[11] Patent Number: 5,245,126

[45] Date of Patent: Sep. 14, 1993

[54] WAVEFORM GENERATION SYSTEM WITH REDUCED MEMORY REQUIREMENT, FOR USE IN AN ELECTRONIC MUSICAL INSTRUMENT

[75] Inventors: Tsutomu Saito, Sizuoka; Yutaka Washiyama, Hamamatsu; Yoichi Nagashima, Shizuoka, all of Japan

[73] Assignee: Kawai Musical Inst. Mfg. Co., Ltd., Sizuoka, Japan

[21] Appl. No.: 433,015

[22] Filed: Nov. 7, 1989

[30] Foreign Application Priority Data

Nov. 7, 1988 [JP] Japan ................ 63-281101
Nov. 7, 1988 [JP] Japan ................ 63-281102

[51] Int. Cl.⁵ ................ G10H 7/00; G11C 0/00

[52] U.S. Cl. ................ 84/604; 84/663

[58] Field of Search ................ 84/601, 602, 603, 604, 84/605, 606, 607, 622; 364/723

[56] References Cited

U.S. PATENT DOCUMENTS

| | | | |
|---|---|---|---|
| 4,036,096 | 7/1977 | Tomisawa et al. | 84/605 |
| 4,133,242 | 1/1979 | Nagai et al. | 84/6 |
| 4,536,853 | 8/1985 | Kawamoto et al. | 84/604 X |
| 4,581,759 | 4/1986 | Takahashi | 84/605 |
| 4,602,545 | 7/1986 | Starkey | 364/723 X |
| 4,641,564 | 2/1987 | Okamoto | 84/605 |
| 4,667,556 | 5/1987 | Hanzawa et al. | 84/603 |
| 4,672,875 | 6/1987 | Suzuki | 84/627 X |
| 4,715,257 | 12/1987 | Hoshiai et al. | 84/604 X |
| 4,754,679 | 7/1988 | Suzuki | 84/622 |
| 4,781,096 | 11/1988 | Suzuki et al. | 84/606 |
| 4,893,538 | 1/1990 | Masaki et al. | 84/605 |
| 4,901,615 | 2/1990 | Matsushima et al. | 84/605 |
| 4,916,996 | 4/1990 | Suzuki et al. | 84/603 |
| 4,928,569 | 5/1990 | Kudo et al. | 84/626 |
| 5,054,358 | 10/1991 | Usami | 84/617 |

*Primary Examiner*—William M. Shoop, Jr.
*Assistant Examiner*—Jeffrey W. Donels

[57] ABSTRACT

A waveform data storing unit stores waveform data only at steps midway among a top zero level step and originally sampled steps at every sampling period from the top zero level step. An output means is included for outputting the waveform data at a moment staggered from another moment, at which the waveform data at the top zero level step and the originally sampled steps are ordinarily read out, by a period of time corresponding to half a step. The occurrence of a difference in phase of the read-out waveform is prevented without the need of a data correction unit. The waveform data storing unit stores midway-step data which are averages of waveform data at adjoining originally sampled steps and difference data representing the difference between the waveform data at the originally sampled steps and the midway-step data. A fine waveform can therefore be obtained while using a smaller quantity of data.

16 Claims, 32 Drawing Sheets

FIG. 14

IES = "L"

| RD4 | RD3 | RD2 | IES | IE8 | IE7 | IE6 | IE5 | IE4 | IE3 | IE2 | IE1 | IE0 |
|---|---|---|---|---|---|---|---|---|---|---|---|---|
| 0 | 0 | 0 | 0 | 0 | 0 | 0 | 0 | 0 | 0 | 0 | RD1 | RD0 |
| 0 | 0 | 1 | 0 | 0 | 0 | 0 | 0 | 0 | 0 | 1 | RD1 | RD0 |
| 0 | 1 | 0 | 0 | 0 | 0 | 0 | 0 | 0 | 1 | RD1 | RD0 | 0 |
| 0 | 1 | 1 | 0 | 0 | 0 | 0 | 0 | 1 | RD1 | RD0 | 0 | 0 |
| 1 | 0 | 0 | 0 | 0 | 0 | 0 | 1 | RD1 | RD0 | 0 | 0 | 0 |
| 1 | 0 | 1 | 0 | 0 | 0 | 1 | RD1 | RD0 | 0 | 0 | 0 | 0 |
| 1 | 1 | 0 | 0 | 0 | 1 | RD1 | RD0 | 0 | 0 | 0 | 0 | 0 |
| 1 | 1 | 1 | 0 | 1 | RD1 | RD0 | 0 | 0 | 0 | 0 | 0 | 0 |

IES = "H"

| RD4 | RD3 | RD2 | IES | IE8 | IE7 | IE6 | IE5 | IE4 | IE3 | IE2 | IE1 | IE0 |
|---|---|---|---|---|---|---|---|---|---|---|---|---|
| 0 | 0 | 0 | 1 | 1 | 1 | 1 | 1 | 1 | 1 | RG2 | RG1 | RG0 |
| 0 | 0 | 1 | 1 | 1 | 1 | 1 | 1 | 1 | 1 | RG2 | RG1 | RG0 |
| 0 | 1 | 0 | 1 | 1 | 1 | 1 | 1 | 1 | RG2 | RG1 | RG0 | 0 |
| 0 | 1 | 1 | 1 | 1 | 1 | 1 | 1 | RG2 | RG1 | RG0 | 0 | 0 |
| 1 | 0 | 0 | 1 | 1 | 1 | 1 | RG2 | RG1 | RG0 | 0 | 0 | 0 |
| 1 | 0 | 1 | 1 | 1 | 1 | RG2 | RG1 | RG0 | 0 | 0 | 0 | 0 |
| 1 | 1 | 0 | 1 | 1 | RG2 | RG1 | RG0 | 0 | 0 | 0 | 0 | 0 |
| 1 | 1 | 1 | 1 | RG2 | RG1 | RG0 | 0 | 0 | 0 | 0 | 0 | 0 |

$RG0 = RD0$ $RG1 = RD0 \oplus RD1$ $RG2 = \overline{RD0 + RD1} \oplus \overline{RD2 + RD3 + RD4}$

RD2、3、4 = "000"

| RD1 | RD0 | RG2 | RG1 | RG0 | DIFFERENCED DATA |
|---|---|---|---|---|---|
| 0 | 0 | 0 | 0 | 0 | UNUSED |
| 0 | 1 | 1 | 1 | 1 | −1 |
| 1 | 0 | 1 | 1 | 0 | −2 |
| 1 | 1 | 1 | 0 | 1 | −3 |

FIG. 15(A)

RD2、3、4 = "000"

| RD1 | RD0 | RG2 | RG1 | RG0 | DIFFERENCED DATA |
|---|---|---|---|---|---|
| 0 | 0 | 1 | 0 | 0 | $-4 \times 2^{*}$ |
| 0 | 1 | 0 | 1 | 1 | $-5 \times 2^{*}$ |
| 1 | 0 | 0 | 1 | 0 | $-6 \times 2^{*}$ |
| 1 | 1 | 0 | 0 | 1 | $-7 \times 2^{*}$ |

FIG. 15(B)

* = 1, 2, 3

FIG. 16

| FRACTION PART | | | MULTIPLIER FACTOR | | | INTERPOLATED VALUE |
|---|---|---|---|---|---|---|
| FA11 | FA10 | FA9 | IM2 | IM1 | IM0 | (SIGN = "0") |
| 0 | 0 | 0 | 1 | 0 | 0 | SAMPLED. − 4/4 × DIFFERENCED. |
| 0 | 0 | 1 | 0 | 1 | 1 | SAMPLED. − 3/4 × DIFFERENCED. |
| 0 | 1 | 0 | 0 | 1 | 0 | SAMPLED. − 2/4 × DIFFERENCED. |
| 0 | 1 | 1 | 0 | 0 | 1 | SAMPLED. − 1/4 × DIFFERENCED. |
| 1 | 0 | 0 | 0 | 0 | 0 | SAMPLED. |
| 1 | 0 | 1 | 0 | 0 | 1 | SAMPLED. + 1/4 × DIFFERENCED. |
| 1 | 1 | 0 | 0 | 1 | 0 | SAMPLED. + 2/4 × DIFFERENCED. |
| 1 | 1 | 1 | 0 | 1 | 1 | SAMPLED. + 3/4 × DIFFERENCED. |

ORDINARY FORM

LOGARITHMIC FORM

FIG. 28

(A)

| KEY ON | PH1 | PH0 | PA1 | PA0 |
|---|---|---|---|---|
| 0 | 0 | 0 | 1 | 1 |
| 0 | 0 | 1 | 1 | 1 |
| 0 | 1 | 0 | 1 | 1 |
| 0 | 1 | 1 | 1 | 1 |
| 1 | 0 | 0 | 0 | 0 |
| 1 | 0 | 1 | 0 | 1 |
| 1 | 1 | 0 | 1 | 0 |
| 1 | 1 | 1 | 0 | 0 |

FIG. 28

(B)

| ECS | PA1 | PA0 | PB1 | PB0 |
|---|---|---|---|---|
| 0 | 0 | 0 | 0 | 0 |
| 0 | 0 | 1 | 0 | 1 |
| 0 | 1 | 0 | 1 | 0 |
| 0 | 1 | 1 | 1 | 1 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

WAVEFORM GENERATION SYSTEM WITH REDUCED MEMORY REQUIREMENT, FOR USE IN AN ELECTRONIC MUSICAL INSTRUMENT

BACKGROUND OF THE INVENTION

1. Field of the Invention

This invention generally relates to an electronic musical instrument, and more particularly, to a waveform generating system and a waveform data storing system for use in electronic musical instruments.

2. Description of the Related Art

Conventionally, a waveform generating system for use in an electronic musical instrument generates a waveform by storing not only data (i.e., waveform data) on the levels of the waveform at predetermined times (i.e., steps), but also difference data representing differences in the levels, of successive steps, and then carries out an interpolation of the waveform data by using the difference data.

This conventional system, however, has a drawback in that a large quantity of data is needed to obtain an almost ideal waveform because the difference data used for the interpolation should cover the total difference in the levels of adjacent points or successive steps sampled for the interpolation. Usually, 10 bits are required to store the waveform data of one step in order to generate a substantially fine waveform, and thus 10 bits are also needed for storing the difference data. Further, even when compressing this data, 7 bits are needed to store the compressed difference data corresponding to one step. Accordingly, a standard 16-bit processor cannot simultaneously read the waveform data and the corresponding difference data for one step at a time.

Further, in the conventional system, when data on the waveform of a half cycle is stored in a memory thereof, data on the waveform of each step to be realized is stored at locations having addresses ranging from the top address "0" of the memory. On the other hand, when reading the waveform data thus stored in the memory, a parameter (hereinafter referred to as a frequency number) having a value corresponding to a sound pitch to be indicated by an operator or user is first accumulated, and the resultant accumulated value thereof is used as an address (hereinafter sometimes referred to as a reading address) for reading the waveform data. Therefore, as shown in FIG. 11(A), at the time of reading the waveform data, when the accumulated value of the frequency number is "0", waveform data not equal to "0" but waveform data stored at the address "0" is read out of the memory, and as a result, a difference in the phase of the output waveform occurs. In the conventional system, to prevent this occurrence of a difference in phase, the accumulated value of the frequency number is corrected by executing a data correction program, or alternatively, a circuit for performing data corrections is provided. For example, the conventional system multiplies the accumulated value of the frequency number by $(-\frac{1}{2})$, and the waveform data is not read if the accumulated value of the frequency number is within the range of from $(-\frac{1}{2})$ to $\frac{1}{2}$. Further, when the accumulated value of the frequency number enters the range of from $\frac{1}{2}$ to 3/2, the waveform data corresponding to the address "0" is read from the memory.

Furthermore, a conventional system generates a waveform, for example, the envelope waveform of the musical sound, by first accumulating speed data having a magnitude corresponding to the gradient of a rising or falling edge of the envelope waveform, and generating the envelope level of each step corresponding to the accumulated value. Usually, the period of the accumulation is in accordance with that of the time sharing processing of generating polyphonic musical sounds by using waveform data of all channels. Nevertheless, if the latter period is assumed to be 1/16 KHz, 1,024,000 (16,000×64) steps corresponding to 20-bit binary data are needed to obtain a musical sound having a substantially prolonged period of the radiation, i.e., having a decay or release time of 64 seconds. Although, in practice, even where the system uses data represented by a smaller number of bits, a musical sound having a relatively good quality can be obtained, such a conventional system has a drawback in that an overflow is liable to occur. In contrast, in another conventional system, the period of the time sharing processing of generating polyphonic musical sounds by using waveform data of all channels is prolonged to prevent the occurrence of an overflow. In such a system, however, a time delay occurs between the actual pressing or releasing of the key and the processing of the start or termination of the radiation of a sound, which is usually performed on the data of each channel. Also, a system has been proposed in which the range of the speed data is narrowed, but such a system has a defect in that the system can generate only very limited kinds of waveforms.

Further, in the conventional system, a circuit for generating musical tone signals comprises a portion for generating musical tone waveform data, another portion for generating envelope waveform data and a multiplying circuit for multiplying the musical tone waveform by the envelope waveform data. The circuit for generating musical tone signals outputs a signal representing the result of the multiplication as a musical tone signal.

This conventional system, however, has drawbacks in that the multiplying circuit to be used for multiplication is expensive and that if each of a multiplier and a multiplicand is represented by using, for instance, eight bits, data representing the result of the multiplication (i.e., the product of the musical tone waveform data and the envelope waveform data) becomes 16-bit data, i.e., the number of bits for representing the result of the multiplication becomes relatively large and as an inevitable consequence, a quantity of data is increased.

SUMMARY OF THE INVENTION

Accordingly, an object of the present invention is to provide a system which can obtain a fine waveform by using a smaller quantity of data.

Another object of the present invention is to provide a waveform generating system which can immediately perform the processing of generating a waveform, while reducing the quantity of the difference data to be stored by half, to thereby eliminate the need for a large memory capacity.

Still another object of the present invention is to provide a waveform storing system which can prevent the occurrence of a difference in phase of the read-out waveform without executing a program for correcting the accumulated value of the frequency number and without the need for a data correction circuit.

A further object of the present invention is to provide a musical sound generating system by which the occurrence of a time delay of the start or termination of radiating a musical sound from an actual operation of keys and the like is prevented even when the number of bits assigned to data to be used for generating a waveform is reduced.

To attain the above objects, and in accordance with a first aspect of the present invention, there is provided a waveform generating system which comprises a waveform data storing means for storing waveform data at a step midway between originally sampled successive steps and difference data representing the difference between the waveform data at the originally sampled step and at the midway step; a waveform data reading means for reading the waveform data at the midway step from the waveform data storing means and the difference data; an interpolating means for performing the interpolation of the waveform data by adding the difference data read out by the waveform data reading means to, or subtracting the difference data from, the waveform data at the midway step; and a musical sound waveform generating means for generating a musical sound waveform from the waveform data at an interpolated step generated by the interpolating means and the waveform data at the midway step read out by the waveform data reading means. Accordingly the quantity of the difference data to be stored in a memory can be reduced by a half, and thus the need for a large memory capacity can be eliminated, and further, the waveform generation processing can be immediately performed.

Moreover, in accordance with a second aspect of the present invention, there is provided a waveform generating system which comprises a waveform data storing means for storing waveform data at a step midway between originally sampled successive steps, a waveform reading means for reading the waveform data at the midway step from the waveform storing means, a calculating means for calculating the waveform data at originally sampled successive steps adjoining each midway step from the waveform data read by the waveform reading means and an output means for outputting the waveform data read by the waveform reading means and the waveform data calculated by the calculating means.

For example, the difference data does not represent the difference between the waveform data at two originally sampled successive steps but represents the difference between the waveform data at an originally sampled step and that at the midway step, thereby halving the quantity of difference data to be stored. The interpolated step can be obtained by simply adding the difference data (which may be multiplied by ¼, ½ or ¾) to the waveform data at the midway step, or by subtracting the difference data (which, may be multiplied by ¼, ½ or ¾) from the waveform data at the midway step. Gates 512 and 517 and circuits 518 to 521, as shown in FIG. 10, are example of the circuit for obtaining the interpolated steps.

Further, in accordance with a third aspect of the present invention, there is provided a waveform generating system which comprises a waveform data storing means for storing midway-step data which is an average of the waveform at two adjoining originally sampled successive steps, a waveform reading means for reading the midway-step data from the waveform storing means and an output means for outputting the midway-step data. The midway-step data is read by the waveform reading means, at a moment staggered from another moment, at which the waveform data at the two adjoining originally sampled successive steps are ordinarily read out, by a period of time corresponding to half of a step.

Thereby, the waveform data to be read is changed each time the reading address is changed, and further, the waveform data is read out by taking the corresponding midway step as a reference address. Accordingly, the correction of the reading address by, for example, executing a correction program or providing a correction circuit, can be omitted.

For example, the read-out waveform data is changed each time the reading address, the range of which is represented by using integers, is changed (for example, from a range between "0" to "1" to another range between "1" to "2"). Further, the waveform data at the midway step is read out by taking the reading address as a center of the above-described range represented by integers such as ½, 3/2 . . . Examples of the waveform data reading means are selector 521 and a NOR gate 517, as shown in FIG. 10.

Furthermore, another object of the present invention is to provide a waveform generating system which can decrease the number of bits required to represent the result of the multiplication of the musical tone waveform data and the envelope waveform data, i.e., the product of the musical tone waveform data and the envelope waveform data in comparison with the conventional system.

To attain this object, and in accordance with a fifth aspect of the present invention, there is described a waveform generating system with comprises an envelope speed data generating means for generating envelope speed data used to determine a rate of changing an envelope waveform, an envelope waveform generating means for generating accumulated envelope data by serially accumulating the envelope speed data and further generating an envelope waveform by using the accumulated envelope data generated by the envelope speed data generating means, a synthesizing means for synthesizing synthesis data from a part of the accumulated envelope data and musical sound waveform data, a shift data generating means for generating shift data by shifting the synthesis data in accordance with the remaining part of the accumulated envelope data and a generation controlling means for controlling the generation of the envelope speed data in such a manner that as a value indicated by the accumulated envelope data becomes larger, a value indicated by the envelope speed data generated by the envelope speed data generating means becomes smaller.

Namely, when the multiplication of the musical tone waveform data and the envelope waveform data is performed, a multiplicand is divided into two parts thereof, i.e., first and second parts. First, one of the first and second parts is multiplied by a multiplier. Then, the result of this multiplication is shifted depending on the other of the first and second parts. Thereby, the number of bits required to represent the result of the multiplication can be decreased.

For instance, this process is performed in the following way in the case where the multiplicand is the envelope waveform data. First, the envelope waveform data is divided into high-order power data and lower-order mantissa data. Next, the lower-order mantissa data is multiplied by the musical tone waveform data. Subsequently, the result of this multiplication is shifted depending on the value of the high-order power data.

FIG. 33 (2) is a diagram for illustrating this processing. In this figure, solid lines indicate data representing the results of the multiplication. Further, dotted curves indicate data obtained by shifting the data representing the results of the multiplication. As illustrated in this figure, linear characteristics of the data prior to the shift are changed into exponential characteristics of the data posterior to the shift. This figure illustrates an example of a downward shift (i.e., a rightward shift) of the data representing the result of the multiplication. Incidentally, in the case of effecting an upward shift (i.e., a leftward shift) of the data representing the result of the multiplication, similar exponential characteristics are obtained after the shift is carried out.

Further, regarding descendent portions of an envelope waveform such as release and decay phase, it is favorable that the shifted data representing such descendent portions has exponential characteristics. This is because descendent portions of waveforms of natural sounds also have exponential characteristics. Moreover, it is desirable for simply calculating data that the data representing the result of the multiplication has linear characteristics.

In contrast, regarding a rising portion of an envelope waveform, i.e., an attack phase of FIG. 33 (2), it is unfavorable that the data representing such a rising portion of the envelope waveform has an exponential characteristic. The reason is that rising portions of waveforms of natural sounds hardly ever have exponential characteristics and thus, musical sounds generated from such rising portions having exponential characteristics are strange. It is desirable that the attack phase of the envelope waveform has a linear characteristic as indicated by a solid line, or an upward convex and exponential characteristic as indicated by a one-dot chain curve.

Thus, there is a necessity of preliminarily changing the characteristic of the attack phase into an upward convex and exponential characteristic prior to the shift. To achieve this purpose, as the level of an envelope waveform rises as illustrated in FIG. 25 (A), a rate of a change in the level of the envelope waveform is made to be smaller and smaller. Thereby, an attack portion of an envelope waveform has a linear characteristic as illustrated in FIG. 25 (B) or an upward convex and exponential characteristic.

In accordance with a fourth aspect of the present invention, there is provided a waveform generating system which comprises a storage means for storing unit data to be accumulated to generate waveform data, a waveform generating means for reading unit data from the storage means for accumulating the unit data read from the storage means and for generating a waveform, a start and termination control means for controlling a start or a termination of the waveform at a short first period and a waveform generation controlling means for controlling the waveform generating means in such a manner to generate the waveform at a second period longer than the first period.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

Other features, objects and advantages of the present invention will become apparent from the following description of a preferred embodiment with reference to the drawings which are given by way of illustration only, and thus are not limitative of the present invention, and in which like reference characters designate like or corresponding parts throughout, wherein:

FIG. 14 is a diagram showing the contents of expanded difference data of the waveform data;

FIG. 15 is a diagram for illustrating the conversion of difference mantissa data to converted mantissa data;

FIG. 16 is a diagram for illustrating the relationship among high order bits FA9–11 of the accumulated value of the frequency number, multiplication data IMO-2 of the difference data, and the interpolated waveform data;

FIGS. 28A and 28B are diagrams showing the contents of the phase parameters used for the conversion effected in the phase control circuit 30;

DESCRIPTION OF THE PREFERRED EMBODIMENT

Hereinafter, a preferred embodiment of the present invention will be described with reference to the accompanying drawings.

1. OUTLINE OF ENTIRE CONSTRUCTION OF THE EMBODIMENT

Figure 1:
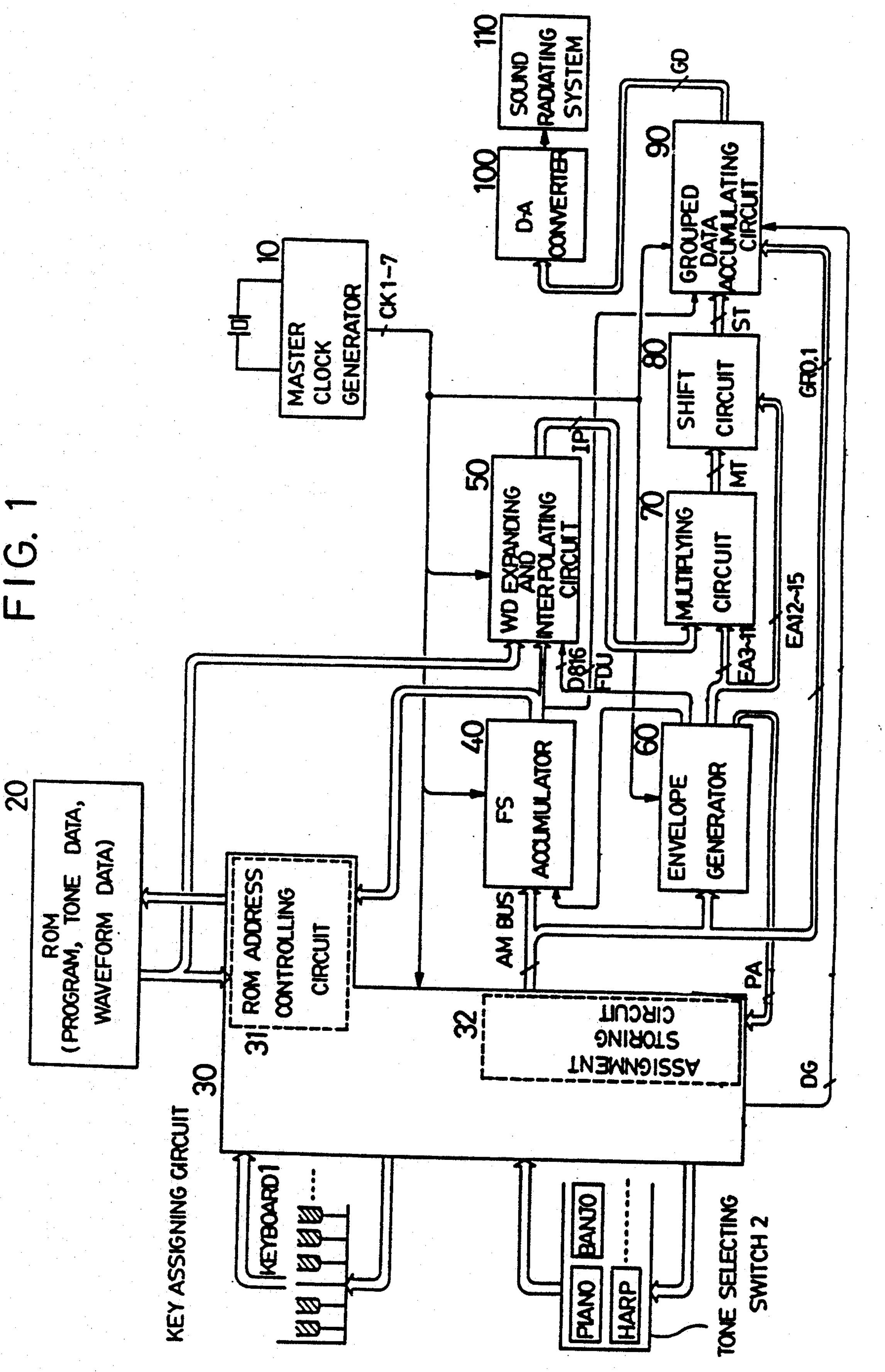
FIG. 1 is a schematic block diagram showing the entire construction of an embodiment of the present invention.

FIG. 1 is a schematic block diagram showing the entire construction of the embodiment of the present invention, wherein each key of a keyboard 1 and each switch of a tone selecting switch board 2 are scanned by a key assigning circuit 30 (hereinafter referred to simply as a key assigner), and then data of a musical sound having a sound pitch corresponding to an operated key and a tone color corresponding to an operated switch is assigned to an idle channel of a 16-channel musical sound generating system of this embodiment. Further, information on the assignment of the data of the musical sound to the channel is stored in an assignment storing circuit 32.

A read-only memory (ROM) 20 stores a processing program for generating musical sound signals, tone data relating to waveforms of musical sounds and concerning envelopes used for generating musical sounds and waveform data RD. A ROM address control circuit 31 controls the addressing of locations in the ROM 20, from which the program and the data are read out, to change a reading from one of the processing program, the tone data and the waveform data to another thereof. The processing program read out of the ROM 20 is sent to a central processing unit (CPU) 300 of the key assigner 30, where various processes are performed. Further, the tone data read out of the ROM 20 is written into an area, which corresponds to the idle channel, of the assignment storing circuit 32, and waveform data RD similarly read from the ROM 20 is sent to a waveform data (WD) expanding and interpolating circuit 50. In the assignment storing circuit 32, frequency number speed data FS corresponding to the key operated in the keyboard 1 is also written into the area corresponding to the idle channel.

Frequency number speed data FS corresponding to each channel is sequentially accumulated in a frequency number speed data accumulating device (hereinafter referred to simply as an FS accumulator) 40 and is further supplied to the ROM address controlling circuit 31 as data (hereinafter referred to simply as reading address data) of addresses of the ROM 20 from which the waveform data RD are read out. Accordingly, the waveform data RD corresponding to the frequency number speed data FS (i.e., corresponding to the pitch of the sound) is read out of the ROM 20 and input to the WD expanding and interpolating circuit 50. A large amount of waveform data RD is stored in the ROM 20 and selectively read therefrom in accordance with bank data read out of the assignment storing circuit 32. In the WD expanding and interpolating circuit 50, difference data, obtained by data compression of the waveform data RD and read from the ROM 20, is expanded, and interpolating positions between successive sampling positions of each waveform data RD are obtained. Further, the expanded data and the thus-obtained data indicating the interpolating positions are sent to a multiplying circuit 70. The interpolation of the waveform data RD is effected by using a part of data, sent from the FS accumulator 40, indicating the values of the accumulated frequency number speed data FS.

On the other hand, the data relating to envelope is sent from the assignment storing circuit 32 to an envelope generator 60 which generates envelopes, and thereafter, the thus-generated envelopes are sent therefrom to the multiplying circuit 70, whereupon each value obtained by sampling the expanded and interpolated waveform data IP resulting from the expansion and interpolation of the waveform data RD effected in the circuit 50 is multiplied by each value EA obtained by sampling an envelope waveform. Data ST indicating the result of the multiplication is then sent to and shifted by a shift circuit 80, and the thus-shifted data is grouped by a sound generating system and used to generate sounds therefrom; the data of each group being separately accumulated in a grouped data accumulating circuit 90. Further, the data of each group is sent through a digital-to-analog (DA) converter 100 to a sound radiating system 110, which radiates musical sounds in accordance with the converted data.

The envelope generator 60 sends a signal PA indicating a current phase to the assignment storing circuit 32, and the circuit 32 outputs envelope data relating to the next phase. The envelope generator 60 also sends an on-event signal to the FS accumulator 40 at the start of a "key on" state, i.e., turning on the key to make the accumulator 40 start accumulating the data FS. Furthermore, the envelope generator 60 sends a data length signal D816 to the WD expanding and interpolating circuit 50 which determines whether or not the interpolation of the waveform data RD is to be effected. The data length signal D816 indicates that the waveform data RD is composed of two sampled values, each of which is represented by using 8 bits, or that the data RD is composed of a sampled value represented by using 10 bits and a difference data represented by using 6 bits. Namely, when the sampled value represented by 10 bits and the difference data represented by 6 bits are read, the interpolation of the waveform data RD is effected.

The shift circuit 80 shifts the data ST, obtained by the multiplication, from left to right (i.e., the data is shifted down) in accordance with the magnitude of an envelope power data, represented by high order bits EA12–EA15 of the accumulated value EA of the envelope, to make the radiated musical sound correspond to natural sound by giving an exponential form to attenuating portions of the envelope corresponding to an attack time and a release time. Note, reference characters referring to consecutive elements such as EA12–EA15 are abbreviated as EA12–15 in this specification, and further, reference characters referring to two elements such as EA11 and EA14 are sometimes abbreviated as EA11, 14.

Further, four musical sound generating groups of the data are formed in the DA converter 100 in a time sharing manner. In response to group data GR sent from the assignment storing circuit 32, the grouped data accumulating circuit 90 determines to which of the musical sound generating groups the data ST received from the shift circuit 80 belongs. This circuit 90 is also supplied by the FS accumulator 40 with a waveform folding signal FDU having a level which becomes high when the generation of a preceding or first half of the waveform of one period or cycle is finished and the generation of the latter or second half of the waveform commences. The grouped data accumulating circuit 90 inverts the musical sound data in response to the signal FDU. Furthermore, a gate signal DG is fed from the key assigner 30 to the circuit 90, which controls the output of the musical sound data to the DA converter 100. On the other hand, a master clock generator 10 sends signals (for example, clock signals CK1–7), described later, shown in FIG. 2 to the circuits 30, 40, 50, 60 and 90 of FIG. 1, to thereby control the timing of various operations of these circuits.

2. ROM 20

Figure 3:
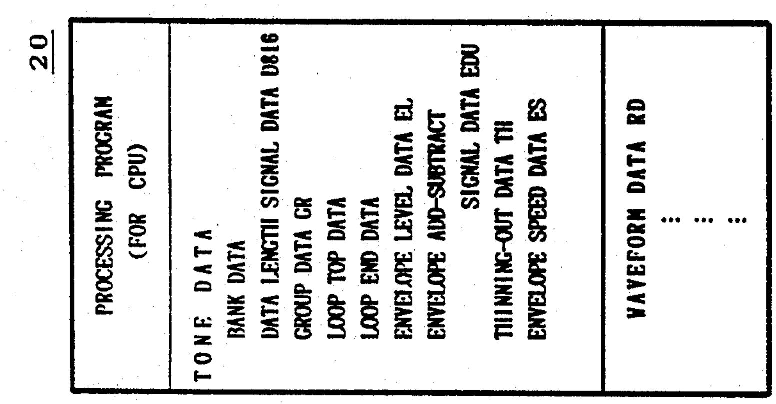
FIG. 3 is a diagram showing the contents stored in a ROM 20.

FIG. 3 shows the contents in the ROM 20. As shown in this figure, this ROM 20 stores a processing program for generating the musical sound signals, tone data relating to the waveforms of musical sounds and concerning the envelopes used for generating musical sounds, and the waveform data RD. The top address of the storage area used for storing the tone data is separated from that of the storage area for storing the processing program, by MMU address data explained later. The tone data is composed of bank data, the data length signal data D816, the group data GR, initial frequency number data, loop top data, loop end data and envelope data. The envelope data consists of phase level data or phase parameters PH, envelope add-subtract signal data EDU, thinning-out data TH, and envelope speed data ES.

First, the bank data is used for selecting and designating one of a plurality of the waveform data RD, and two waveforms (A) and (B) are selected per tone assigned to one channel on the basic of the bank data.

Next, as described above, the data length signal D816 is used for indicating that the waveform data RD is composed of two sampled values each represented by using 8 bits, or that the data RD is composed of one sampled value represented by using 10 bits and one difference data represented by using 6 bits.

Further, as above stated, the group data GRO,1 is used for indicating to which of four musical sound generating groups the data ST obtained by the multiplication is assigned.

Figure 8:
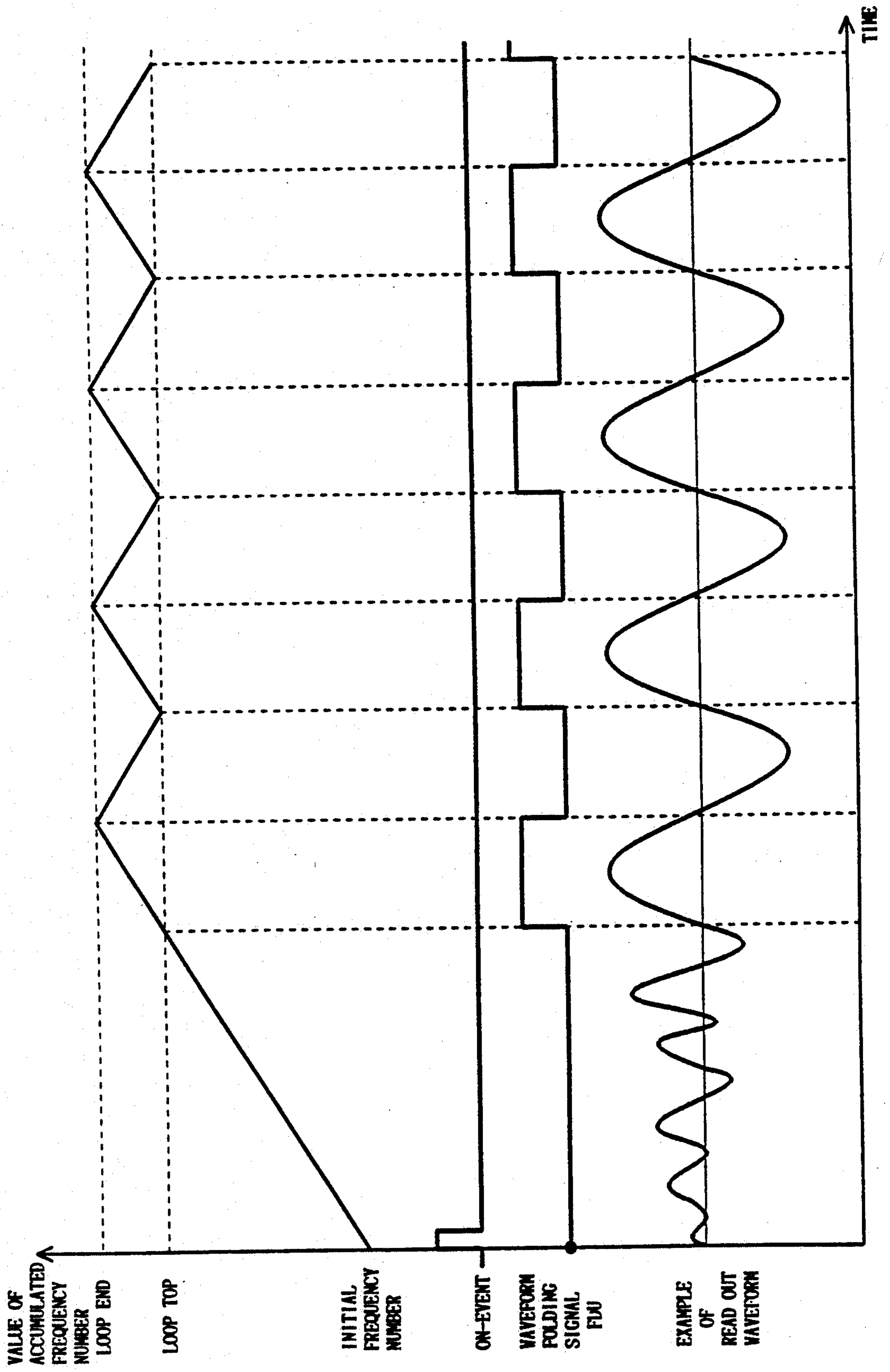
FIG. 8 is a diagram illustrating the manner of reading the waveform data.

Referring now to FIG. 8, at the initiation of the operation of reading the waveform data RD from the ROM 20, an initial value of a parameter or variable used for sequentially accumulating the frequency number speed data FS and reading out the waveform data RD is indicated by the initial frequency number data. The loop end data indicates the value of the accumulated frequency number FA at an upper turning point by which the accumulated frequency number speed data FS is calculated by serially adding the frequency number speed data FS thereto, and further the loop top data indicates the value of the accumulated frequency number FA at a lower turning point from which the value of the accumulated frequency number FA is calculated by serially subtracting the frequency number speed data FS therefrom. As shown in this figure, the waveform data of the waveforms of first and second half cycles composing the continuous waveform of one cycle can be read out by repeatedly varying the value of the accumulated frequency number FA between the values indicated by the loop top data and the loop end data.

Note, the waveform folding signal FDU indicates the most significant bit of the accumulated frequency number FA. Further, the level of the signal FDU becomes high when the first half cycle is finished and the second half cycle commences. The above described change in the accumulating operation at the turning points (i.e., the change between the addition and the subtraction of the data FS) as well as the inversion of the sign of the sampled values of the waveform data (i.e., the sign of the values of the amplitude of the waveforms, and thus that of the musical sound data) is made on the basis of this signal FDU.

Figure 26:
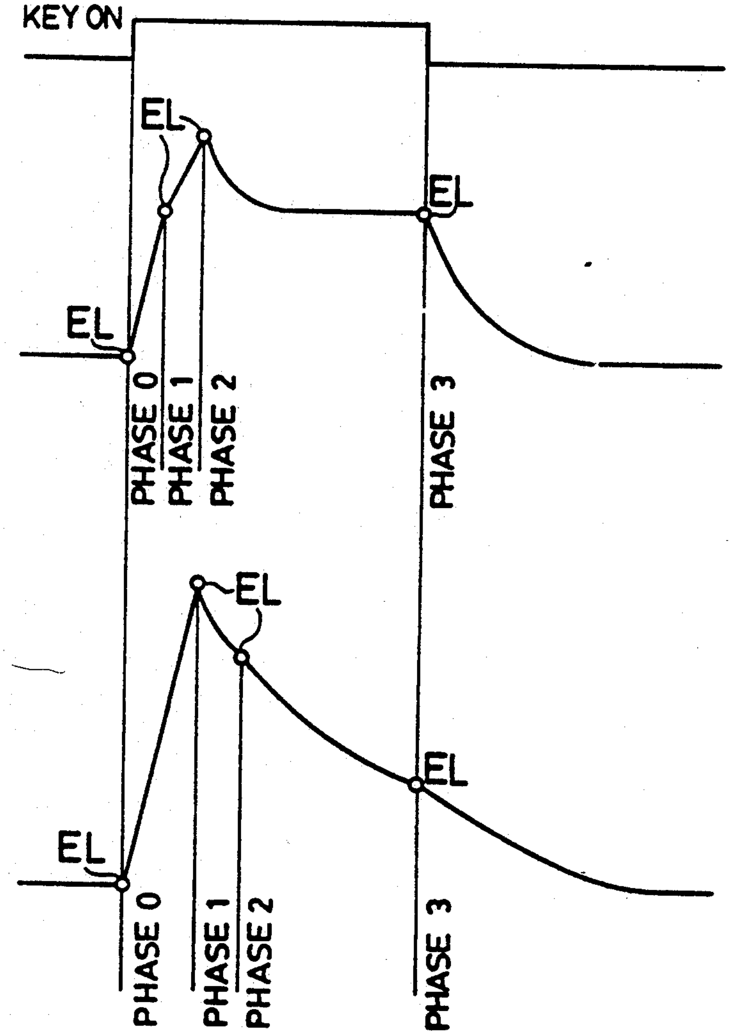
FIG. 26 is a waveform chart for illustrating envelope phases.

The envelope level data of the envelope data indicates the accumulated value of the envelope at the last or terminating points of the attack phase, the decay phase, the sustain phase and the release phase, as shown in FIG. 26. The envelope add-subtract signal data EDU indicates whether an addition or subtraction of the accumulated value EA is to be performed, and the envelope speed data ES of the envelope data indicates the rate or speed of the addition or subtraction of the accumulated value EA of the envelope. The gradient at each point of the envelope waveform is in proportion to the value of the envelope speed data ES. The envelope speed data ES and envelope level data EL are determined in accordance with Key touch data obtained in response to the speed and the pressure by which the key is pressed.

The thinning-out data TH of the envelope data indicates the rate of thinning out the accumulated values EA by latches (hereinafter referred to simply as the latch thinning-out rate) for fetching the accumulated values EA into an accumulating system. Originally, the latching of the accumulated values EA is performed once every time slot repeated with respect to all of the channels, but where the data TH is "11", the thinning of the values EA is not performed, and conversely, where the data TH is "10", "01" and "00", the value EA is fetched into the accumulating system at each of 4 times, 16 times and 64 times of the latching thereof, respectively. The numerals 0 and 1 of the above described representation "00", "01", "10" and "11" of the data TH correspond to binary logical levels indicating a low state and a high state, respectively. By this thinning-out operation, if the value of the envelope speed data is not changed, a two-fold, four-fold, sixteen-fold and sixty four-fold increase in the speed of generating the envelope can be achieved. The thinning-out data TH may be varied in accordance with the key touch data obtained in response to the speed and the pressure by which the keys of the keyboard 1 are pressed.

As described above, the ROM 20 stores the processing program for generating and radiating the musical sound and the musical sound data representing the contents or properties of the musical sound, and thus the provision of only a single memory for storing the processing program and the musical sound data in the apparatus simplifies the configuration of the circuits thereof.

3. KEY ASSIGNING CIRCUIT 30

Figure 4:
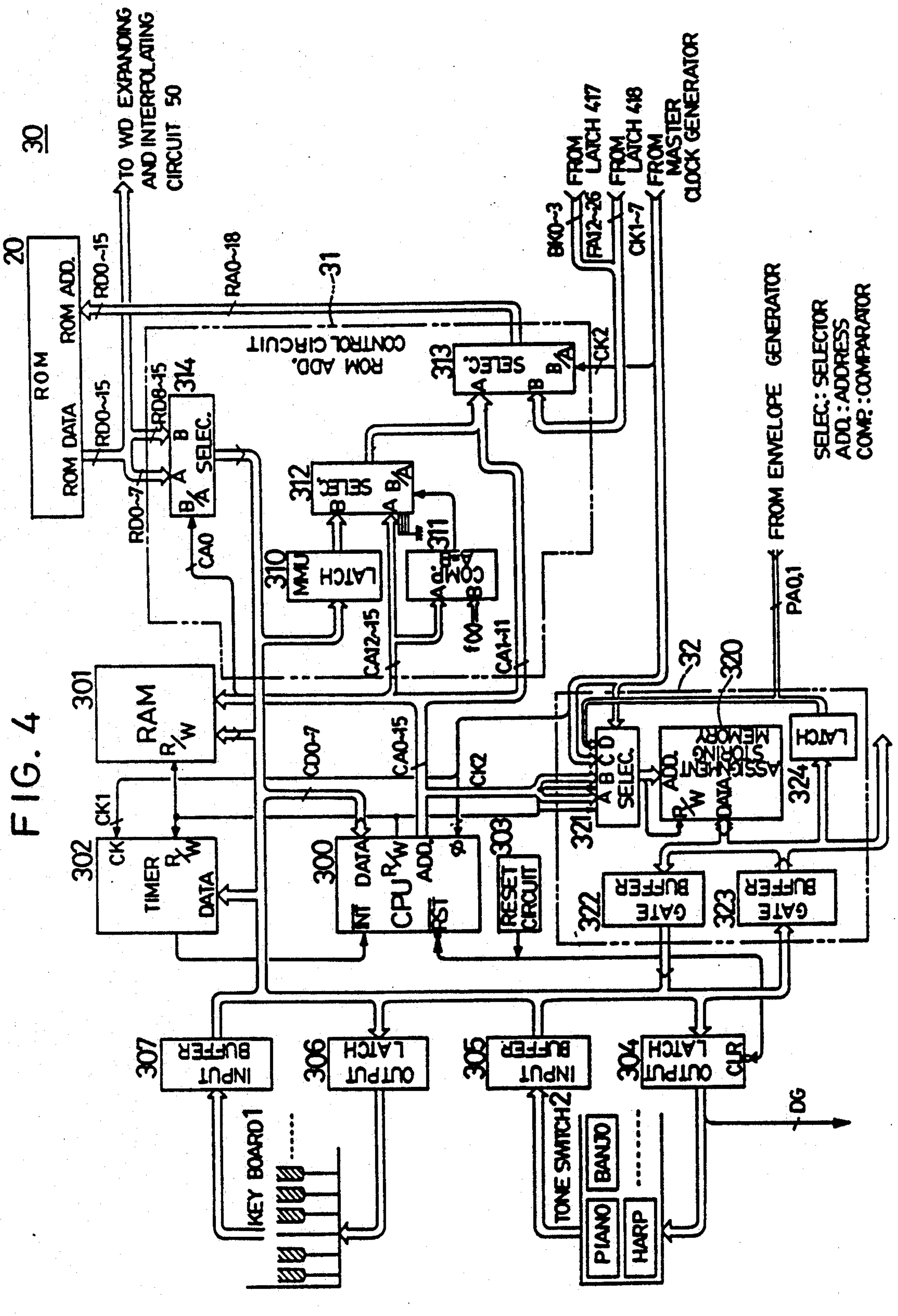
FIG. 4 is a schematic block diagram showing the construction of the key assigning circuit 30.

FIG. 4 is a schematic block diagram showing the construction of the key assigning circuit 30. The CPU 300 shown in this figure is operative only when a master clock signal 0 (CK2) is at a high level. As seen from FIG. 2, data relating to the CPU 300 flows through data and address bus lines only when the master clock signal CK2 is at a high level (corresponding to "1"), and conversely this other data not related to the CPU 300 flows therethough when the master clock signal is at a low level (corresponding to "0").

4. ROM ADDRESS CONTROLLING CIRCUIT 31

The address data sent from the CPU 300 for accessing the ROM 20 and other storage devices is represented by using 16 bits CA0-15. As shown in FIG. 4, the data indicated by the low order bits CA1-11, excepting the least significant bit CA0, is supplied to a selector 313. On the other hand, data formed by adding four bits "0000" to the four bits CA12-15 as upper bits thereof is fed to the ROM 20 through the selector 313 as address data represented by using 19 bits together with the lower bits CA1-11, whereby the reading of the processing program is mainly performed. Further, when the CPU 300 reads tone data and so forth other than the processing program, the MMU address data represented by using 8 bits is output through the data bus line, the MMU latch 310 and the selector 312. The MMU address data is further added to the eleven low order bits CA1-11 and supplied to the ROM 20 through the selector 313.

Figure 5:
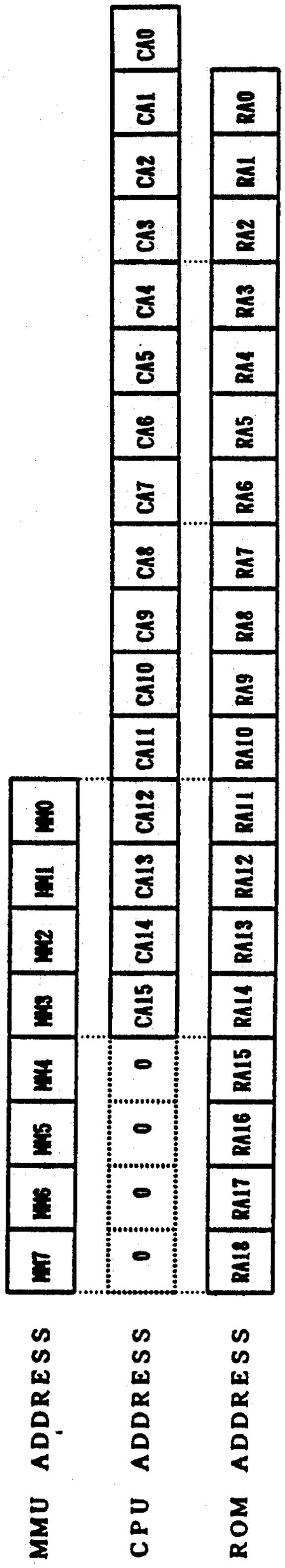
FIG. 5 is a diagram showing the relationship between the address data of a central processing unit 300 and that of a read-only memory 20.

FIG. 5 is a diagram showing such a modification of this data. Although the ROM address data RA0-18 is represented by using 19 bits, the address data CA0-15 (hereinafter referred to as CPU address data) output by the CPU 300 is represented by using 16 bits, and thus, the four bits "0000" and the MMU address data are added to the CPU address data. Further, by selectively adding the MMU address data or the four bits "0000" to the CPU address data, a reading by the CPU 300 from the processing program can be easily changed to a reading from the tone data, and vice versa. Furthermore, even where the CPU address data is represented by using bits having a number less than that of bits used for representing the ROM address data, the whole area of the ROM 20 can be read by such a simple modification of the CPU address data.

Referring again to FIG. 4, the data represented by the four high order bits CA12-15 is supplied to a comparator 311, to which other data f(x) represented by using four bits is also supplied, and when the former data CA12-15 does not match the latter data f(x), the data formed by the bits "0000" and the address data CA1-2-15 is selected. When a match is made, a coincidence signal is supplied from the comparator 311 to the selector 312, and further, an MMU latch 310 is selected. Therefore, when the address data CA12-15 does not match the data f(x), the processing program to be executed by the CPU 300 is read out of the ROM 20. On the other hand, when a match is made, the tone data and so forth are read therefrom. This data f(x) may be dynamically established by the CPU 300 or preliminarily set as fixed data.

Figure 2:
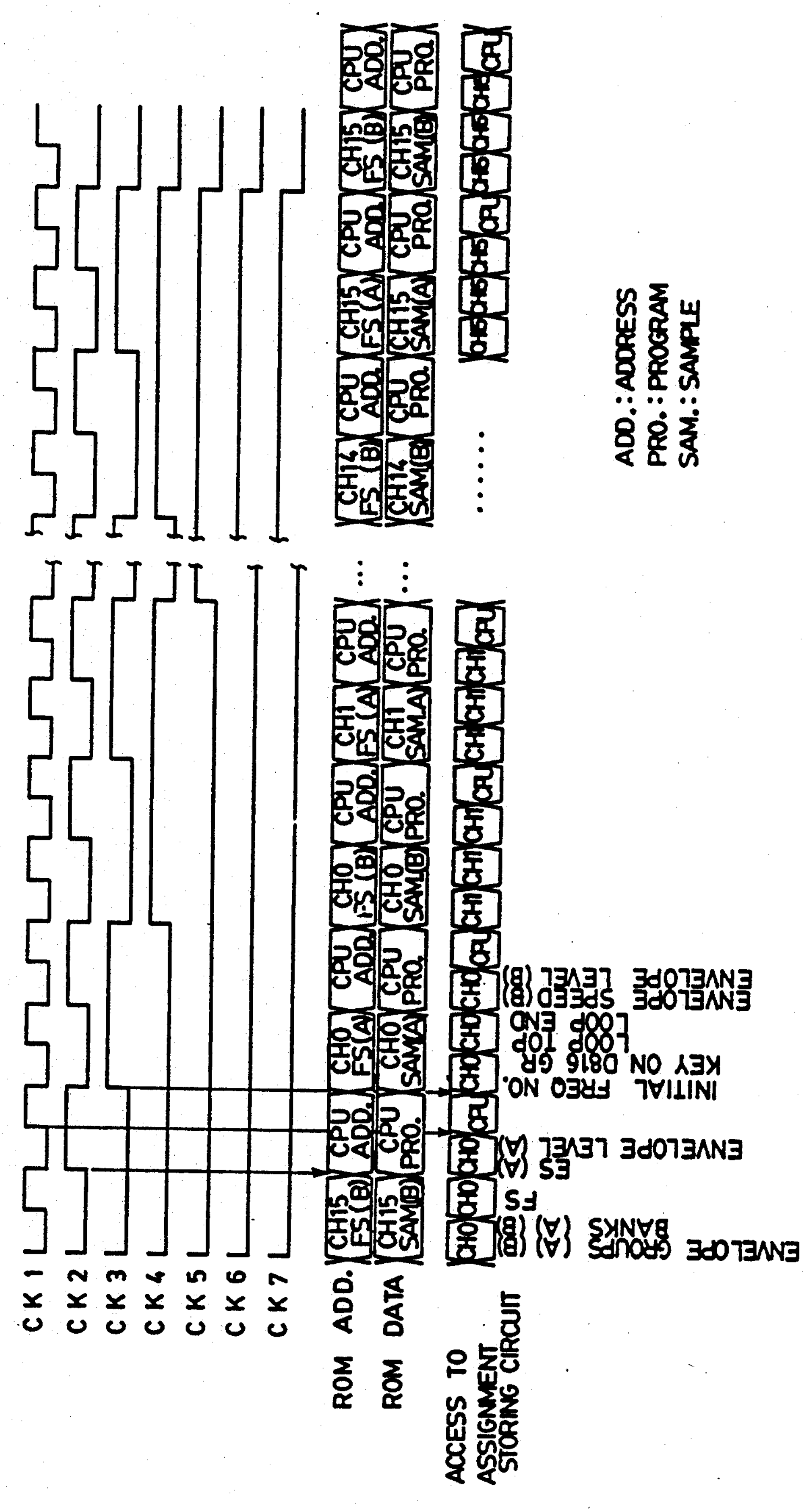
FIG. 2 is a timing chart for illustrating the operations of the circuits of FIG. 1 and a key assigning circuit 30.

The bank data read by the CPU 300 from an assignment storing memory 320, which will be described in detail, as well as the values FA12-26 obtained by accumulating the data FS and sent from the FS accumulator 40, is supplied through the selector 313 to the ROM 20 from which the waveform data RD of a corresponding bank is obtained. Further, the above described data selection by the selector 313 is performed on the basis of the clock signal CK2 issued from the CPU 300, and thus as shown in FIG. 2, the reading from the processing program is changed and a sampled value of the waveform data RD is read and vice versa, in accordance with the ROM DATA signal shown in the lower part of this figure. Where the processing program is read out, the reading from the processing program can be further changed to a reading from the tone data, in accordance with the data f(x). Such a reading operation is repeatedly performed with respect to all of the 16 channels.

Among the data read from the ROM 20, the waveform data RD is sent to the WD expanding and interpolating circuit 50 without change. Conversely, the processing program and the tone data are each bisected into two data, each represented by using 8 bits, which are sent to the CPU 300 through a selector 314 or to the assignment storing memory 320 through a gate buffer 323. The data selection in the selector 314 is effected in accordance with the value of the least significant bit (LSB) CA0 of the address data CA sent from the CPU 300, whereby the fetching of the data from the ROM 20 is performed in accordance with the CPU 300. Further, even if the number of bits required to represent the data read out of the ROM 20 is greater than that of bits required to represent data transferred on the data bus line connected to the CPU 300, the data processing can be smoothly carried out.

5. ASSIGNMENT STORING CIRCUIT 32

Figure 6:
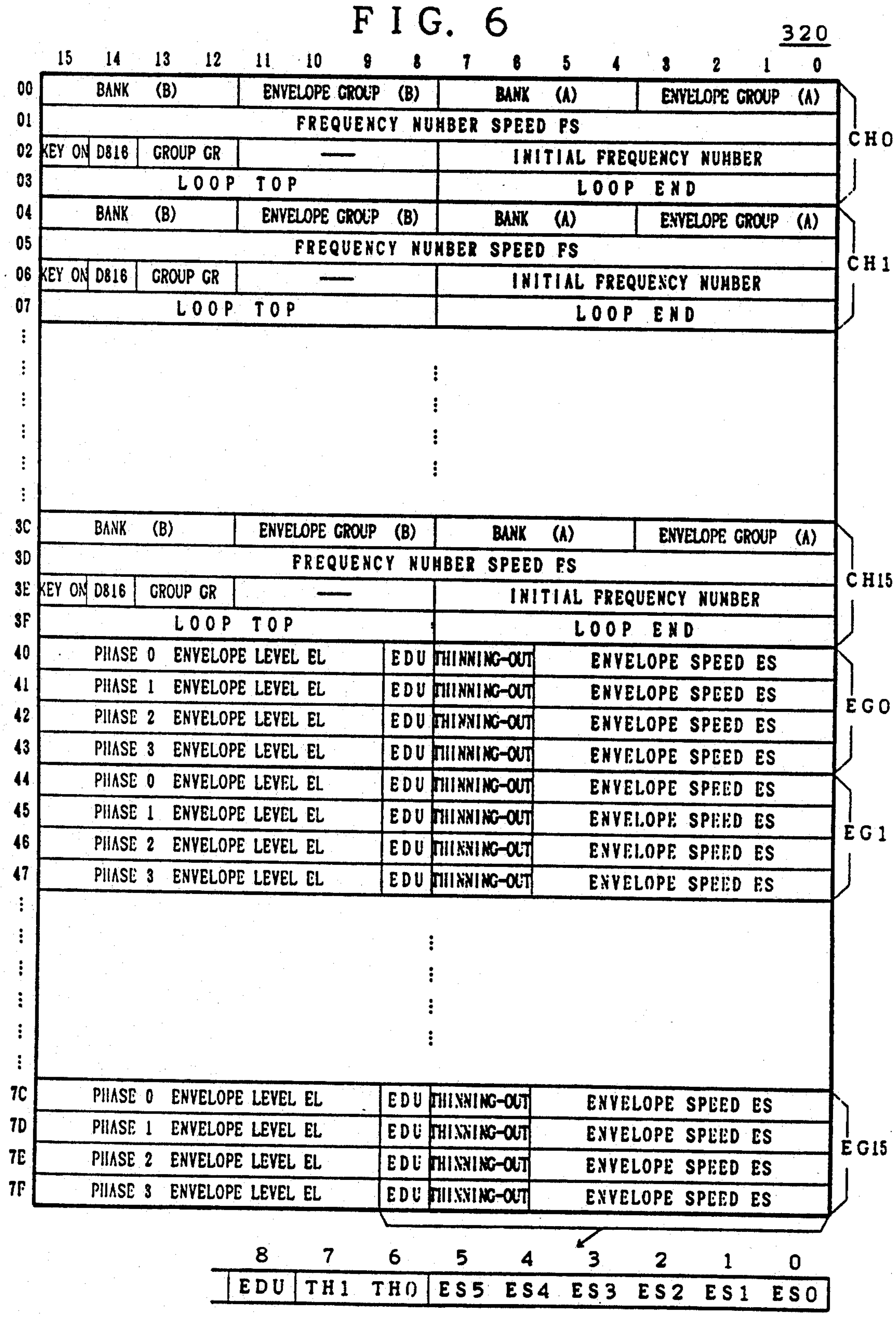
FIG. 6 is a diagram illustrating the contents stored in an assignment storing memory 320 of an assignment storing circuit 32.

FIG. 6 is a diagram illustrating the contents stored in the assignment storing memory 320 of the assignment storing circuit 32. Memory areas for storing the tone data of 16 channels are formed in the assignment storing memory 320, and in each of the memory areas (hereinafter referred to as channel areas), the tone data sent from the ROM 20 is set. In this case, among the tone data to be set therein, the envelope data is set in each corresponding one of envelope group areas EG0-15, and the other data is distributed to and set in each of the channel areas CH0-15. The data to be set in the channel areas CH0-15 is composed of the bank data (A) and (B), the envelope group data (A) and (B), the frequency number speed FS, a "key on" signal data, the data signal D816, the group data GR, the initial frequency number data, the loop top data and the loop end data. Among this data, the data other than the frequency number speed data FS, the "key on" signal data, and the envelope group data (A) and (B) are as described above. The data FS corresponds to a sound pitch represented by the pressed key of the keyboard 1 and is used as data indicating the value of accumulated steps of address data for reading the waveform data RD. The key on signal data indicates that the apparatus is in a "key on" state, i.e., a key is turned on, and is equal to "1" in the "key on" state and to "0" in a "key off" state in which the keys are turned off. The envelope group data (A) and (B) indicate the addresses of the envelope group areas EG0–15 in which the envelope data corresponding to the tone data set in the channel areas is stored. Further, two envelope groups (A) and (B) exist because the tone data to be assigned to a channel is composed of two data corresponding to two musical sound data. Namely, two corresponding waveform data (A) and (B), and further two corresponding bank data (A) and (B), exist. Note, the envelope data, which is set in the envelope group areas EG0–15, is as described above in the description of the ROM 20.

The data read out of this assignment storing memory 320 is sent out through an assignment storing memory (AM) bus to the FS accumulator 40 and the envelope generator 60 and so on, and to the CPU 300 through the gate buffer 322. On the other hand, four-bit envelope group data (A) and (B) are again supplied to the assignment storing memory 320 through a selector 321 after the number of bits used for representing data (A) and (B) are increased to 7 by adding phase data represented by using 2 bits as data represented by higher order bits and adding the value "1" represented by using one bit as data represented by a lower order bit. Accordingly, the envelope level data EL, the thinning-out data TH, the envelope speed data and so forth, of the corresponding envelope, are read therefrom and sent to the envelope generator 60. The address data represented by a set of clock signals CK sent from the master clock generator 10, as well as the access address data supplied from the CPU 300, are also fed to the assignment storing memory 320.

FIG. 2 shows a timing chart illustrating such a modification of the address data at the bottom thereof. First, the envelope group data (A) and (B), the bank data (A) and (B) and the frequency number speed data FS are read out of the memory 320, in this order, on the basis of the set of clock signals CK. Then the envelope speed data (A) ES and the envelope level data (A) EL are read therefrom on the basis of the envelope group data (A) and the phase data PA, and therefore, the CPU 300 is accessed. Following the access to the CPU 300, the initial frequency number data, the "key on" signal data, the data length signal data D816 and the group data GR are read out of the memory 320 on the basis of the set of the clock signals CK, and thereafter the loop top data and the loop end data are read. Then the envelope speed data (B) ES and the envelope level data (B) EL are read from the memory 20 on the basis of the envelope group data (B) and the phase data PA, and therefore, the CPU 300 is once more accessed. The above described process is repeatedly performed with respect to the data assigned to the 16 channels.

In this case, the signals CK1–7 of FIG. 2 are employed as the set of the clock signals CK used for representing the address data which indicates the data to be read. The selection of each address data is effected by the selector 321 on the basis of the clock signals CK1 and CK2. When 2-bit data, the value of the leftmost bit of which is represented by the clock signal CK2 and that of the rightmost bit of which is represented by the clock signal CK1, is "00" or "01", the set of the clock signals CK are selected as the address data. Further, when the 2-bit data is "10", the envelope group data and the phase data PA are selected as the address data. In addition, when the 2-bit data is "11", the address data sent from the CPU 300 is selected.

Data to be used in various intermediate processing is stored in a random-access memory (RAM) 301, and a timer 302 supplies interrupt signals to the CPU 300 at intervals established by the CPU 300. A reset circuit 303 operates to reset the CPU 300 and an output latch 304 when the power is turned on. The sampling addresses of the keyboard 1 and the tone switch 2 are temporarily stored in the output latch 304 and another output latch 306. Further, the results of the sampling are input to input buffers 305 and 307. Note, a signal representing data of only a single bit of the sampling data set in the output latch 304 is used as a gate signal for the DA converter 100.

6. FS ACCUMULATOR 40

Figure 7:
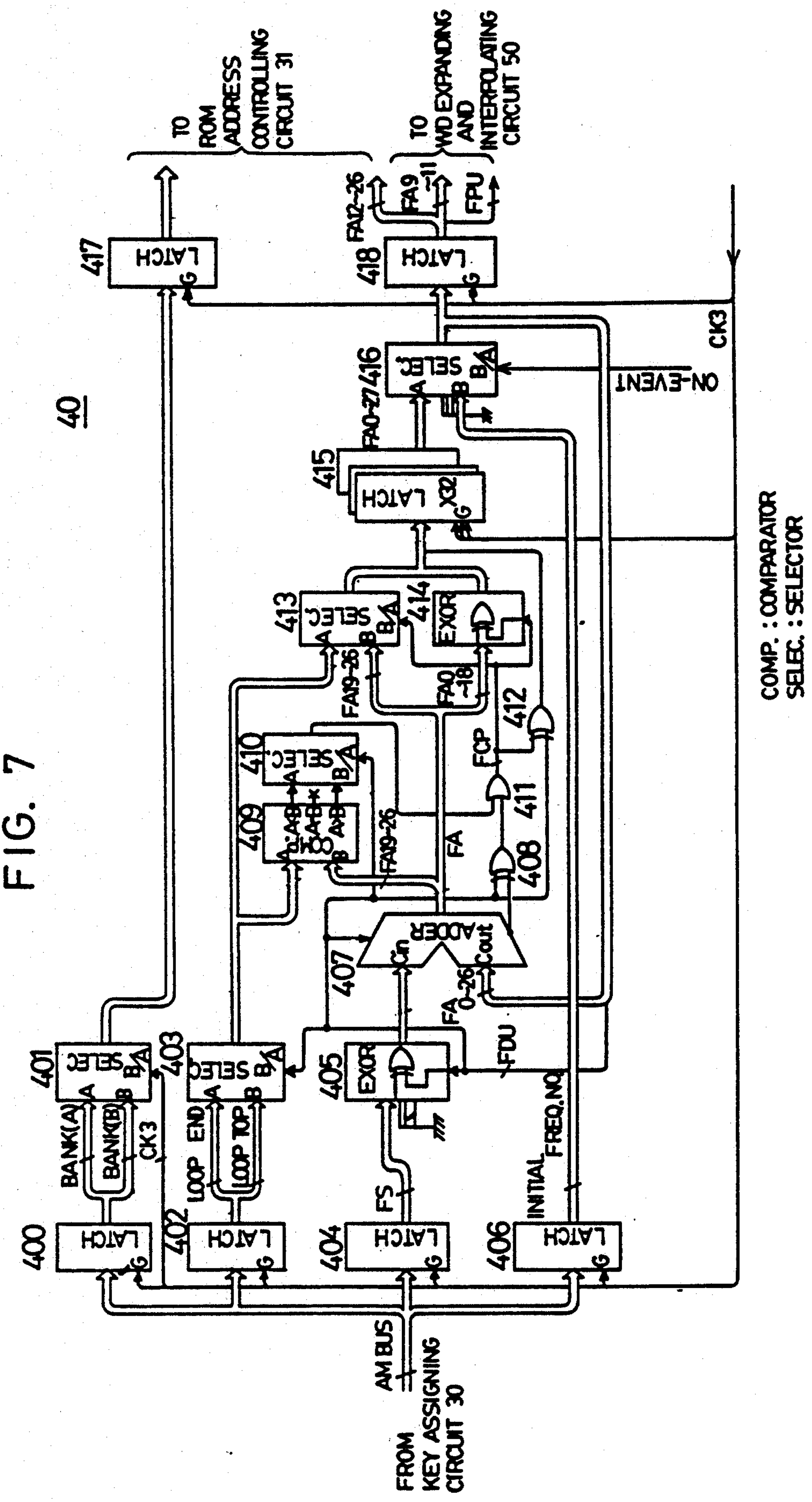
FIG. 7 is a schematic block diagram showing the construction of a frequency number speed data accumulator 40.

FIG. 7 is a schematic block diagram showing the construction of the FS accumulator 40. The data FS represented by the signals sent from the assignment storing circuit 32 is transferred through a latch 404 and EXCLUSIVE-OR (hereinafter abbreviated as EX-OR) gates 405 to an adder 407, whereupon the FS data is accumulated, i.e., added to the accumulated value FA, the 8 high order bits FA19–26 of which are transferred through a selector 413 to a group of latches 415 and the 19 low order bits FA0–18 are sent through a group of EX-OR gates 414 to the group of latches 415. Then the data represented by these bits FA0–26 is supplied through the group of latches 415 and a selector 416 to the adder 407 as the accumulated value FA. Accordingly, the values FA are accumulated at a speed corresponding to the magnitude of the data FS, and further, the 15 high order bits FA12–26 (corresponding to an integer part) of the accumulated value FA are sent to the ROM address controlling circuit 31 through a latch 418, to thereby read the waveform data RD. On the other hand, a signal indicating data represented by the 3 high order bits FA9–11 of a fractional part of the value FA and the waveform folding signal indicating data represented by the most significant bit (MSB) of the value FA are sent to the WD expanding and interpolating circuit 50, whereupon the expansion and interpolation of the samples of the data RD are effected by using the data represented by the bits FA9–11 and MSB.

Figure 9:
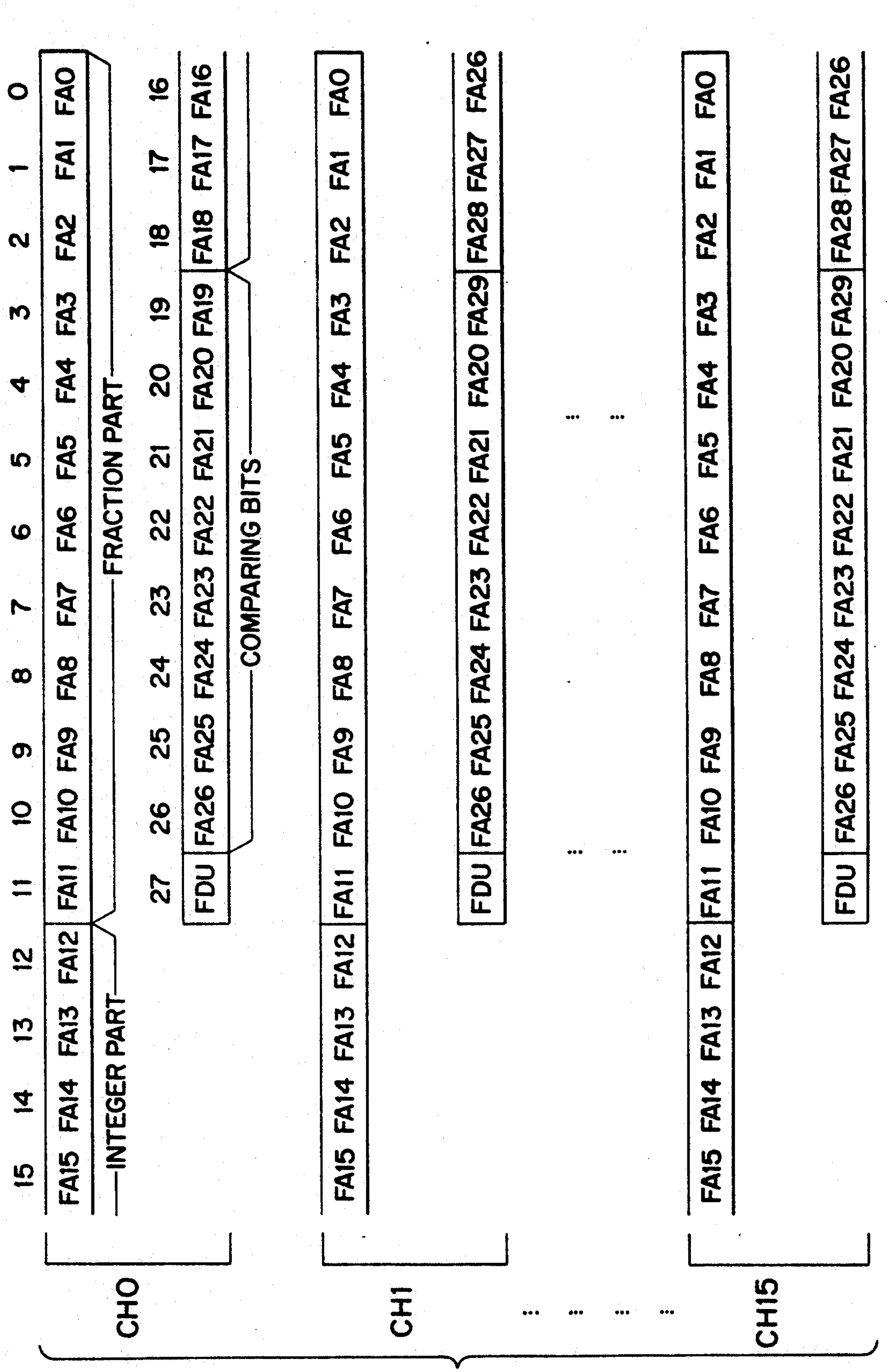
FIG. 9 is a diagram showing the contents of the accumulated value FA of the frequency number.

FIG. 9 is a diagram showing the contents of the value FA, which is represented by using 28 bits. The value at the MSB is represented by the waveform folding signal FDU. Further, the high order bits FA19–26 are comparing bits representing data to be used for comparisons made to determine whether or not the value FA has reached the turning points indicated by the loop top or loop end data, the intermediate order bits FA12–18 indicate an integer part of the value FA, and the low order bits FA0–11 indicate a fractional part of the value FA. The data FS of the 16 channels CH0–15 is accumulated in the FS accumulator 40, and the value FA corresponding to each channel is stored in the group of the latches 415 composed of 16 latches. To read the two musical sound components (A) and (B), the data of the same addresses, i.e., the values represented by the bits FA19–26 are used. The difference in tone color is due to the difference between the bank data (A) and (B).

The assignment storing memory 32 sends a signal indicating the initial frequency number data through a latch 406 to the selector 416, whereupon the data "0" represented by using 1 bit is added to the left side of the MSB of the initial frequency number and the data "00 . . . 00" represented by using 19 bits is added to the right side of the LSB of the initial frequency number. The data obtained by thus modifying the initial frequency number is selected by the selector 416 as data represented by 28 bits, similar to the value FA. As a selection signal issued from this selector 416, the "on-event"

signal output from the envelope generator 60 at the time of starting a "key on" state is used. As shown in FIG. 8, the data FS is sequentially accumulated or added to the initial frequency number from the time of starting a "key on" state (corresponding to the origin of the graph of this figure).

Further, the loop top data and the loop end data are sent from the assignment storing memory 32 through the latch 402 to the selector 403, whereupon one of the loop top data and the loop end data is selected. The thus selected data is transferred from the selector 403 to a comparator 409 and the selector 413. In the comparator 409, the selected data is compared with the comparing bits (i.e., the 8 high order bits FA19-26 of the value FA), and if the value FA is not within the range between the loop top data and the loop end data, the selector 410 outputs an overrun signal FCP to the group of EX-OR gates 414 and to the selector 413, through an OR gate 411, and the loop top data or the loop end data is replaced by data represented by the comparing bits FA19-26, i.e., is taken into the accumulator 40 as new data. At that time, in the group of EX-OR gates 414, the sign of the integer part and the fractional part of the value FA is inverted, so that a fraction of the current value FA at a turning point can be used simply by changing the sign thereof when reading the waveform data RD of the next half cycle, in which the sign of the waveform data RD is inverted, to properly coordinate the reading operations of the current and the next half cycles.

The overrun signal FCP is also supplied to an EX-OR gate 412, to invert the waveform folding signal FDU indicating the MSB of the value FA, whereby the sign of the value of the data FS in the group of the EX-OR gates 405 is changed, and the operation of the adder 407 is changed from one of the adding and the subtracting operations to the other thereof with respect to the data FS. FIG. 8 shows how the reproduction of the waveform data RD is performed by changing the operation of the adder 407 from one of the adding and the subtracting operations to the other thereof at each half cycle.

The waveform folding signal FDU is supplied to the selectors 403 and 410 as a selection signal. When performing an addition of the data FS, the signal representing the loop end data and an "A<B" event detecting signal are selected. Conversely, when performing a subtraction of the data FS, the signal representing the loop top data and an "A>B" event detecting signal are selected. The signal FDU is also input to the adder 407 at a Cin terminal thereof, whereupon the value FA is incremented by 1 when performing a subtraction of the data FS. Further, the signal FDU is fed to an EX-OR gate 408 to which an output signal is sent from a Cout terminal of the adder 407, to thereby detect an overflow or an underflow in the calculation of the value FA. At that time, the overrun signal FCP is output from the OR gate 411.

Furthermore, the bank data (A) and (B) are sent from the assignment storing memory 32 through a latch 400 to the selector 401, whereupon one of the data (A) and (B) is selected. The selected data is sent from the selector 401 through a latch 417 to the ROM address controlling circuit 31, whereby the reading of the waveform data RD is performed.

Therefore, with regard to the two musical sound data components (A) and (B) assigned to a channel, the bank data is different but the common value FA is used to synchronize the processing of the generation of musical sounds.

Further, the clock signal CK3 is output from the master clock generator 10 as the selection signal input to the selector 401 indicating the selected data. The processing of generating the musical sound (A) is effected in a first or former half cycle of the clock signal CK3, and the processing of generating the musical sound (B) is performed in a second or latter half cycle thereof.

The group of the clock signals CK is supplied to the latches 400, 402, 404, 406, 415, 417 and 418 as a latch signal to obtain a channel synchronization and to synchronize the musical sound generating processing.

7. WD EXPANDING AND INTERPOLATING CIRCUIT 50

Figure 10:
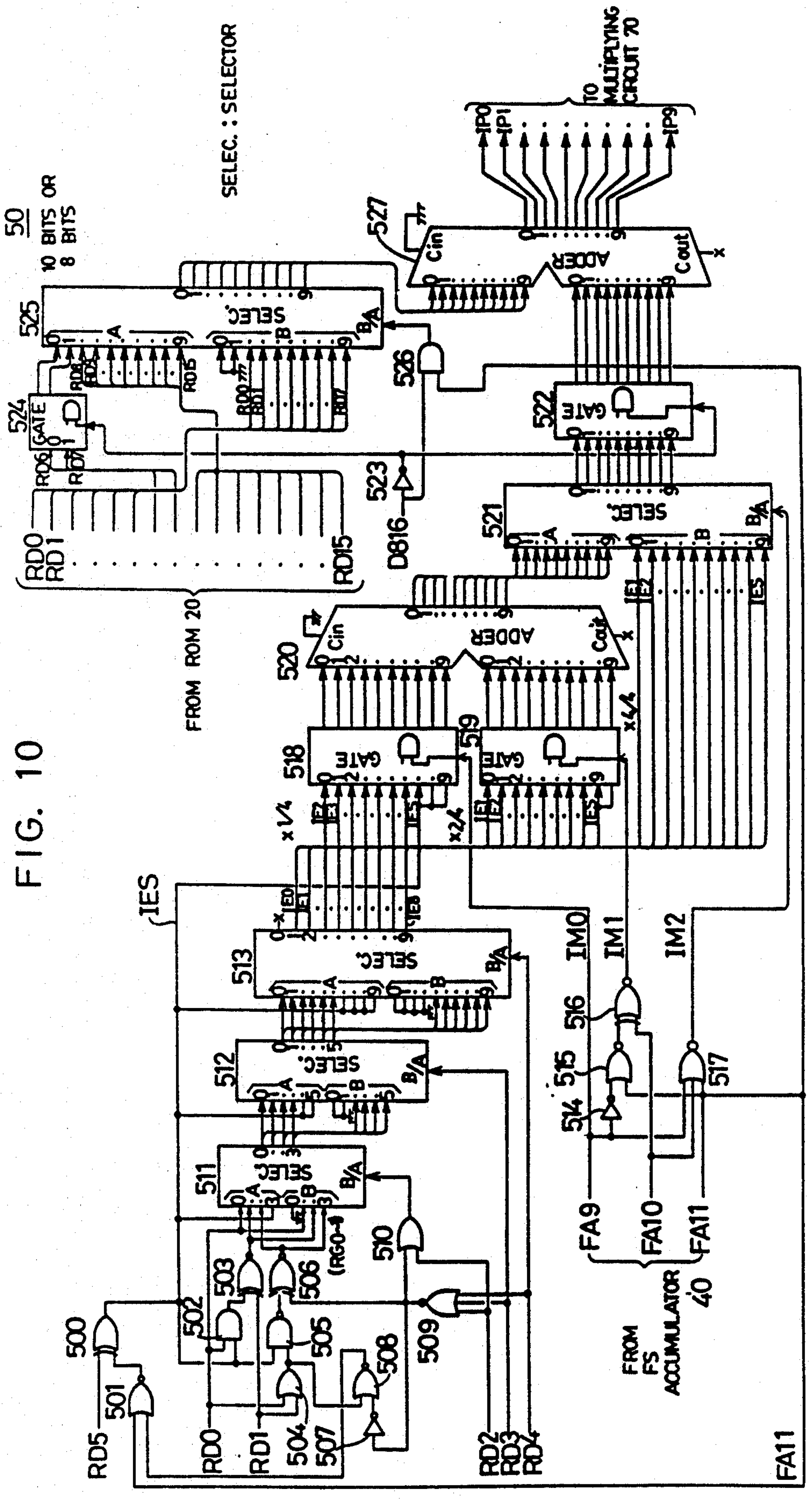
FIG. 10 is a circuit diagram showing the construction of a waveform data expanding and interpolating circuit 50.
Figure 12:
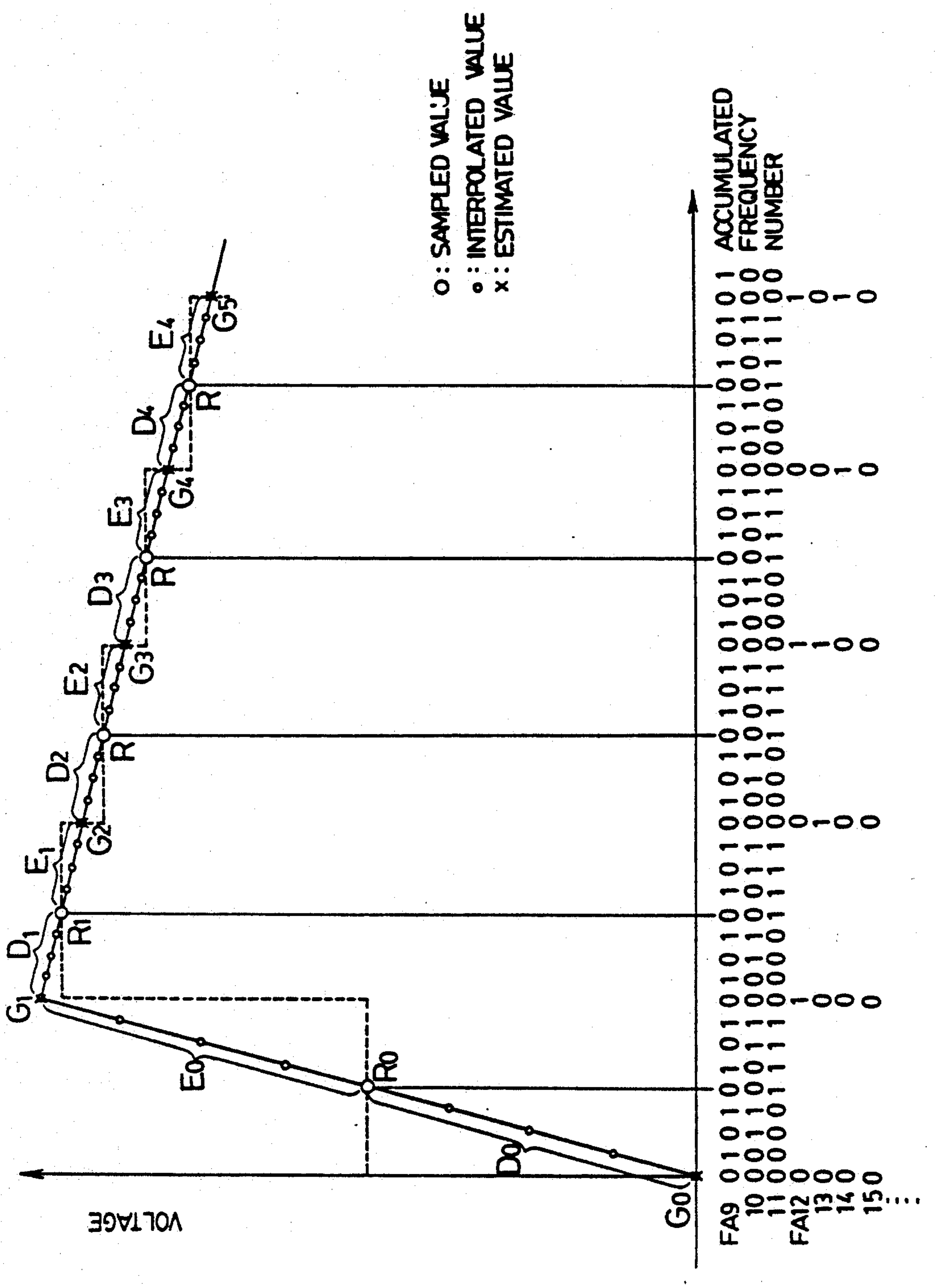
FIG. 12 is a graph showing the relationship between the sampled values and interpolated values of the waveform data.

FIG. 10 is a circuit diagram showing the construction of the WD expanding and interpolating circuit 50. The expansion of difference data of the waveform data RD as shown in FIG. 14 is effected by gates 500-510 and selectors 511-513, and further, the interpolation of sampled values $R_0$, $R_1$, $R_2$ and $R_3$ . . . of the waveform data RD as shown in FIG. 12 is effected by gates 514-517, groups of gates 518 and 519, an adder 520, and a selector 521. Furthermore, where the waveform data RD is composed of the sampled value represented by using 10 bits and the difference data represented by 6 bits (D816="0" (corresponding to a low level "L")), the interpolation is effected by groups of gates 524 and 522, a gate 526, a selector 525, and an adder 527. Conversely, the interpolation is not effected where the data RD is composed of two sampled values represented by 8 bits (D816="1" (corresponding to a high level "H")).

7.1 OUTLINE OF DATA PROCESSING EFFECTED BY CIRCUIT 50

Figure 13:
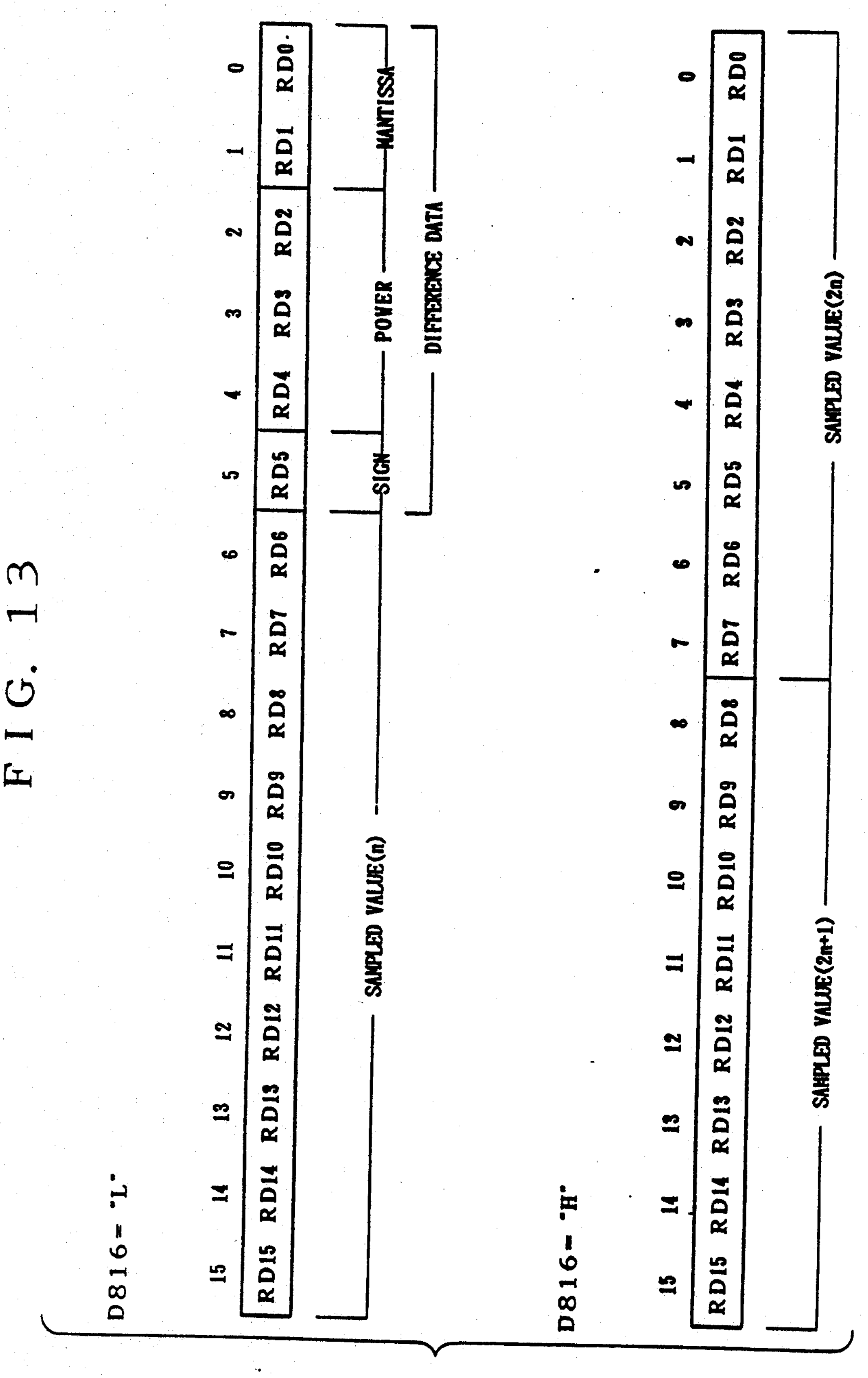
FIG. 13 is a diagram showing the contents of the waveform data RD.

FIG. 13 is a diagram showing the contents of the waveform data read out of the ROM 20. When the data length signal D816 has a low level "L" (corresponding to "0") and the data RD is composed of a sampled value represented by using 10 bits and a difference data represented by using 6 bits, 10 high order bits RD6-15 indicate the sampled value; a bit RD5, the sign of the difference data; bits RD2-4, the power of the difference data; and bits RD0-1, the mantissa of the difference data. The difference data RD0-4 is compressedare and stored, and an expansion of the compressed difference data provides an expanded difference data IE0-8 and IES represented by using 10 bits as shown in FIG. 14. Namely, the data of the power (hereinafter referred to as the difference power data) RD2-4 indicates the order of a bit, at which "1" first appears, of the difference data. Further, the data of the mantissa (hereinafter referred to as the difference mantissa data) represented by 2 bits RD0-1 indicates the data per se stored in the 2 bits following the first appearing "1". Namely, the data format shown in FIG. 14 (A) is used when adding the expanded difference data. On the other hand, the data format shown in FIG. 14 (B) is used when subtracting the expanded difference data, and in this case, the data of the power RD2-4 indicates the order of a bit, to which "1" appears from the LSB, of the difference data. The converted difference mantissa data RG0-2 following this is obtained by converting the difference mantissa data by using the logical expressions shown at the bottom of FIG. 14 (B). The results of this conversion are equivalent to data obtained by changing the sign of the difference data as shown in FIG. 15. This expanded difference data IE0-8 and IES is equivalent to one-half of the difference between two adjacent sampled values of the waveform data RD indicated by the larger white circles in FIG. 12, and thus indicates the difference between the sampled value and an adjacent estimated value indicated by a saltire in this figure. In this figure, saltires indicating the estimated values overlap with the smaller white circles indicating the values obtained by interpolating the sampled values.

The sampled values $R_0$, $R_1$, $R_2$ . . . of the waveform data RD are obtained where the fractional part of the value FA is equal to one-half. Therefore, to realize the waveforms indicated by saltires in FIGS. 11 (B) and 12, it is only necessary to store the estimated values $G_0$, $G_1$, $G_2$ . . . , which are indicated by saltires, at points midway between the points at which the sampled values are $R_0$, $R_1$, $R_2$ . . . . Therefore, the sampled values $R_0$, $R_1$, $R_2$ . . . are obtained by the following equations: $R_0=(G_0+G_1)/2$; $R_1=(G_1+G_2)/2$; $R_2=(G_2+G_3)/2$, . . .

Figure 11:
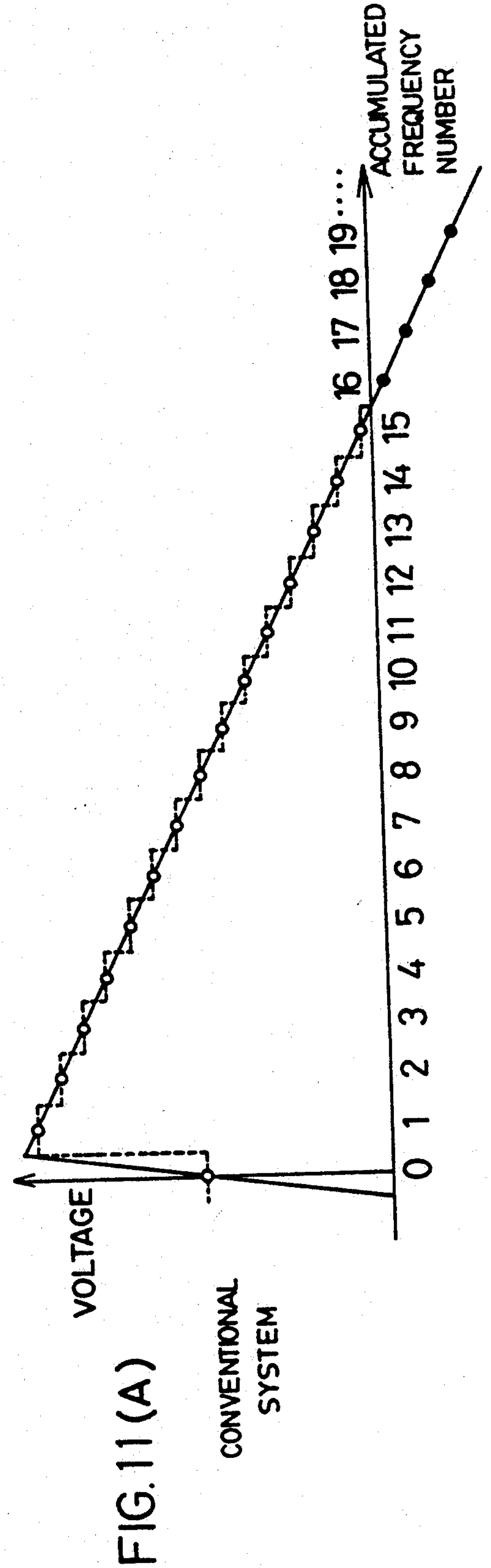
FIGS. 11A and 11B are graphs showing the relationship between the sampled values of the waveform data of a half-wavelength and an accumulated frequency number.
Figure 11:
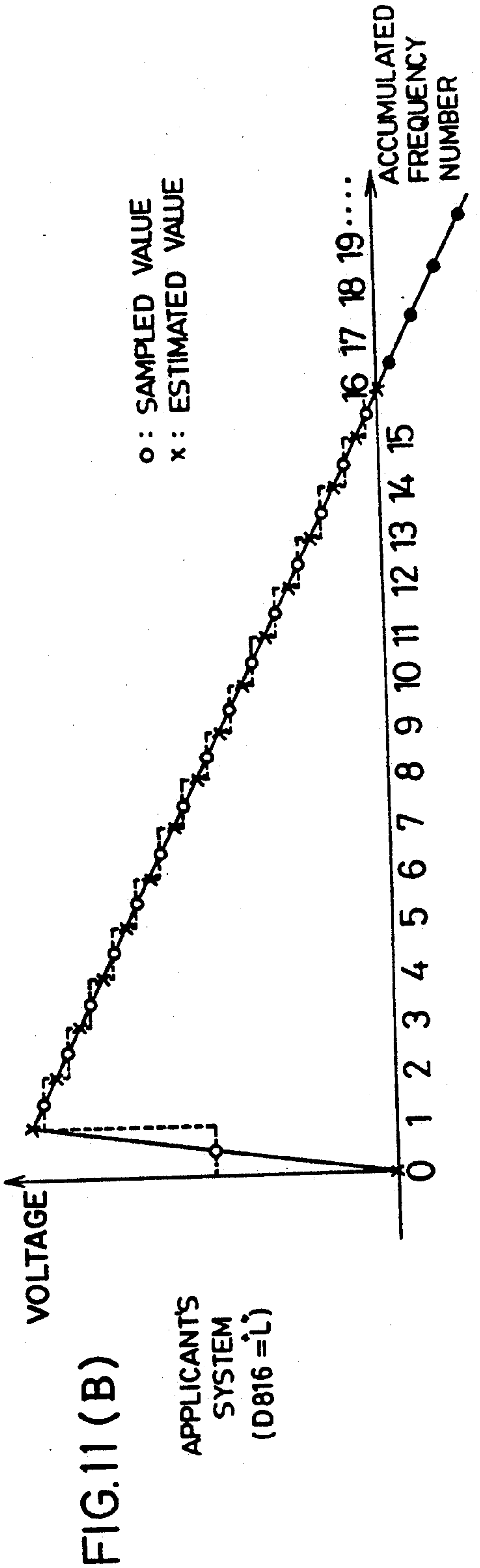

By storing the estimated values $G_0$, $G_1$, $G_2$ . . . indicated by the saltires . . . at the points midway between the sampling points $R_0$, $R_1$, $R_2$ . . . , the level of the waveform data RD is precisely adjusted to 0 at a starting point at which the value FA is equal to "0000" as shown in FIGS. 11 (B) and 12. Namely, although the level, which is not equal to 0, of the first step of the waveform data RD is usually stored at the top or leading address of the memory area of the ROM 20 used for storing the waveform data RD, the level of the waveform data can be automatically adjusted to 0 at the origin at which the value FA is "0000", without preventing the reading of the non-zero data of the first step, and thus the difference in level of the waveform data at the origin as shown in FIG. 11 (A) does not occur.

Further, the difference in level of the data RD between a midway point, which is present between the adjacent points indicated by saltires, and an interpolated point just prior to the midway point, is equal to that in the level between the midway point and another interpolated point just after the midway point, and as a result, the difference data to be stored can be reduced to one-half of the original difference data. Usually, when the sampled value of the data RD is represented by using 10 bits, the difference data is also represented by using 10 bits. Therefore, even if the above described compressing method is used, 4 bits are necessary for representing the difference power, and thus the compressed difference data is represented by using at least 7 bits. As stated above, in this embodiment however, the difference data can be reduced to one-half thereof, i.e., the number of bits required to represent the difference data can be reduced to 6 bits, and thus the total number of bits representing the sampled value of the data RD and the difference data can be reduced to 16 bits and can be accessed at a time of a usual access to data.

Therefore, if the number of times of reading the waveform data RD per unit time is reduced to one-half thereof by alternately reading the data RD and the processing program (or the tone data) from a single ROM 20, the apparatus of the present invention can provide a satisfactory performance.

Note, the waveform indicated by the data RD to be stored may be shaped such that the points representing the estimated values as indicated by saltires in FIGS. 11 (B) and 12 can be connected by polygonal lines.

Further, the value obtained by multiplying the expanded difference data by ¼ (2/4, ¾ or 4/4) is added (in an addition mode) to or subtracted (in a substraction mode) from a sampled value as shown in FIG. 16, to thereby obtain an interpolating value. At that time, if as shown in FIG. 12, the interpolated values $E_0$, $D_1$, $D_2$, $D_3$ . . . are greater than the corresponding sampled values $R_0$, $R_1$, $R_2$, $R_3$ . . . , the expanded difference data is added to the sampled values as shown in FIG. 14 (A). Conversely, if the interpolated values $D_0$, $E_1$, $E_2$, $E_3$ . . . are greater than the corresponding sampled values $R_0$, $R_1$, $R_2$, $R_3$ . . . expanded difference data is subtracted from the sampled values as shown in FIG. 14 (B).

Note, there are two kinds of data formats; one which uses 10 bits and the other which uses 8 bits, for representing the waveform data RD. The latter data format using 8 bits is employed in the case of a noisy sound in which it does not matter if quantizing noise occurs when the number of bits used for quantization is reduced. Conversely, the former data format using 10 bits is employed in the case of sounds in which it does matter if the quantizing noise occurs. Accordingly, the memory area can be substantially reduced.

7.2. CONSTRUCTION OF WD EXPANDING AND INTERPOLATING CIRCUIT 50

Referring to FIG. 10, the difference mantissa data RD0 are input to the selector 511 at the "0" terminal of the group A and at the "1" terminal of the group B, without change. Further, at the "1" terminal of the group A and the "2" terminal of the group B, the difference mantissa data RD1 is input without modification when the value IES represented by the MSB indicates "0". Conversely, when the value IES represented by the MSB indicates "1", and AND gate 502 is enabled and the EX-OR data RG1 of the difference mantissa data RD0 and RD1 is input therefrom. Furthermore, when the value IES represented by the MSB indicates "0", an output of a NAND gate 505 becomes "1" and an output of the NOR gate 509 is inverted by an EX-OR gate 506, and thus the logical sum of the difference power data RD2-4 is input to the "2" terminal of the group A and the "3" terminal of the group B. Conversely, when the value IES represented by the MSB indicates "1", the EX-OR data RG2 of the inverted logical sum of the difference mantissa data RD0 and RD1 and the inverted logical sum of the difference power data RD2-4 are input therefrom. Further, the data IES represented by the MSB is input to the "3" terminal of the group A of the selector 511, and the data "0" is input to the "0" terminal of the group B thereof, whereby data composed of the difference mantissa data RD0,1 and data represented by a higher order bit, or the converted difference mantissa data R0, 1 and 2, the contents of which are shown in FIG. 15, are generated.

The data represented by 2 bits, each indicating the value represented by the MSB IES, is added by a selector 512, and the data represented by 4 bits, each indicating the value IES, is added by a selector 513 to the 4-bit data of this selector 511 as the data represented by higher order bits than the MSB of the 4-bit data. Alternatively, the data represented by 2 bits, each indicating "0", is added by a selector 512, and the data represented by 4 bits, each indicating "0", is added by a selector 513 to the 4-bit data of this selector 511 as the data represented by lower order bits than the LSB of the 4-bit data. Therefore, 10-bit data formed by thus modifying the 4-bit data of the selector 511 is output from the selector 513 as 10-bit data. By appropriately selecting the selecting condition of each of selectors 511, 512, and 513 in accordance with the difference lower data RD2–4, the difference mantissa data RD0,1 or RG0–2 can be shifted as shown in FIG. 14.

Accordingly, the compressed difference data is represented by only 6 bits, but the difference data can be expanded such that the expanded data is represented by using 10 bits, thereby reducing the memory area.

The value of the MSB IES of the difference data to be expanded is determined by the difference sign data RD5 input to the EX-OR gate 500, that indicated by the MSB FA11 of the fractional part of the value FA input to the NOR gate 501, and that indicated by the logical sum, the sign of which is changed, of the bits RD0–4 of the difference data from the NOR gate 508. Namely, as shown in FIG. 12, when the bit FA11 of the value $D_0$ is "0" and the difference sign data represented by the bit RD5 is "0" (i.e., in the addition mode), or when the bit FA11 of each of the values $E_1$, $E_2$, . . . is "1" and the bit RD5 is "1" (i.e., in the subtraction mode), the MSB IES of the difference data is "1", and this indicates that the difference data is to be subtracted from the sampled value. The logical sum, the sign of which is changed or inverted, of bits RDO–5 of the difference data is input to the NOR gate 501. Further, where that the difference data is "00000", an output of the NOR gate 501 is made "0", so that the bit IES does not become "1".

The expanded difference data IE is shifted to the right by 1 bit, i.e., reduced to 2/4 thereof, and then input to a group of terminals of the adder 520 through a group of the AND gates 519. Simultaneously, the data IE is shifted to the right by 2 bits, i.e., reduced to ¼ thereof, and further input to the other group of terminals of the adder 520 through a group of the AND gates 518. Therefore, an output of this adder 520 is supplied to the terminals of the group A of the selector 521. On the other hand, the unshifted data IE is supplied, while the value thereof is unchanged, to a group of terminals of the group B of the selector 521. Therefore, the expanded difference data IE can be changed by factors of ¼, 2/4, ¾, 4/4 and 0 by suitably selecting magnification data IM represented by signals IM0 and IM1, which are enable signals for the groups of the AND gates 518 and 519, respectively, and a signal IM2, which is a selection signal for the selector 521.

The thus changed difference data IE is supplied to the adder 527 through the group of the AND gates 522 and is added to or subtracted from the sampled values RD6–15 of the waveform data RD, which will be described later, whereby the interpolation of the sampled values of the waveform date RD is performed.

Therefore, the waveform data RD having 8 positions can be generated from a sampled value represented by the bits RD6–15 and the difference data represented by the bits RD0–5. Further, a smooth waveform can be obtained, and the memory capacity can be reduced, and in addition, the waveform data RD, a single data of which enables a determination of the levels of the waveform at 8 positions at a time, can be read out at once. Therefore, even if the number of times of reading the waveform data RD is low, a sufficiently smooth waveform can be realized, and consequently, if the waveform data RD and other information such as programs are alternately read out of the ROM 20, the processing of generating the waveform can be performed without hindrance. Furthermore, if the program and the waveform data are stored together in the ROM 20, there is no need to increase the rate of reading the various information.

The magnification data IMO–2 is generated by the logical gates 514–517 from the 3 high order bits FA9–11 of the fractional portion of the value FA, and the groups of gates 514 and 517 performs the conversion of the data as illustrated by FIG. 16 to obtain the interpolated values of the waveform data RD. In this case, if only the MSB FA11 of the fractional part of the value FA is "1", i.e., the value FA is equal to ½, the interpolation of the sampled values is not effected. Further, prior to that time, the interpolated values are obtained by subtracting ¼, 2/4 and ¾ of the difference data from the value FA. Conversely, after that time, the interpolated values are obtained by adding ¼, 2/4 and ¾ of the difference data to the value FA.

Where the waveform data RD0–15 is composed of a sampled value represented by using 10 bits and a difference data represented by using 56 bits, the sampled value RD6–15 is input to the group A of the selector 525 and are then supplied to the adder 527 without modification, to calculate the interpolated values. At that time, the data length signal D816 indicates "0", and thus the groups of the AND gates 524 and 522 are enabled and the AND gate 526 is disabled, and in addition, the group A of the selector 525 is selected. Where the waveform data RD0–15 is composed of two sampled values each represented by using 8 bits, a portion of the waveform data RD0–7 is input from the group B of the selector 525 and then supplied to the adder 527, and another portion of the waveform data RD8–15 is input from the group A of the selector 525 and is thereafter supplied to the adder 527. At that time, two bits "00" are added to each of the data RD0–7 and RD8–15 as the lower order bits than the LSB of each data, to thereby change the data into 10-bit data. Furthermore, at that time, the data length signal D816 indicates "1", and thus the groups of the AND gates 524 and 522 are disabled and the interpolation of the waveform data RD is not performed. Further, the AND gate 526 is then enabled, and thus the sampled values represented by the bits RD0–7 and RD8–15 are switched in accordance with the value "1" or "0" of the MSB FA11 of the fractional part of the value FA.

8. ENVELOPE GENERATOR 60

Figure 17:
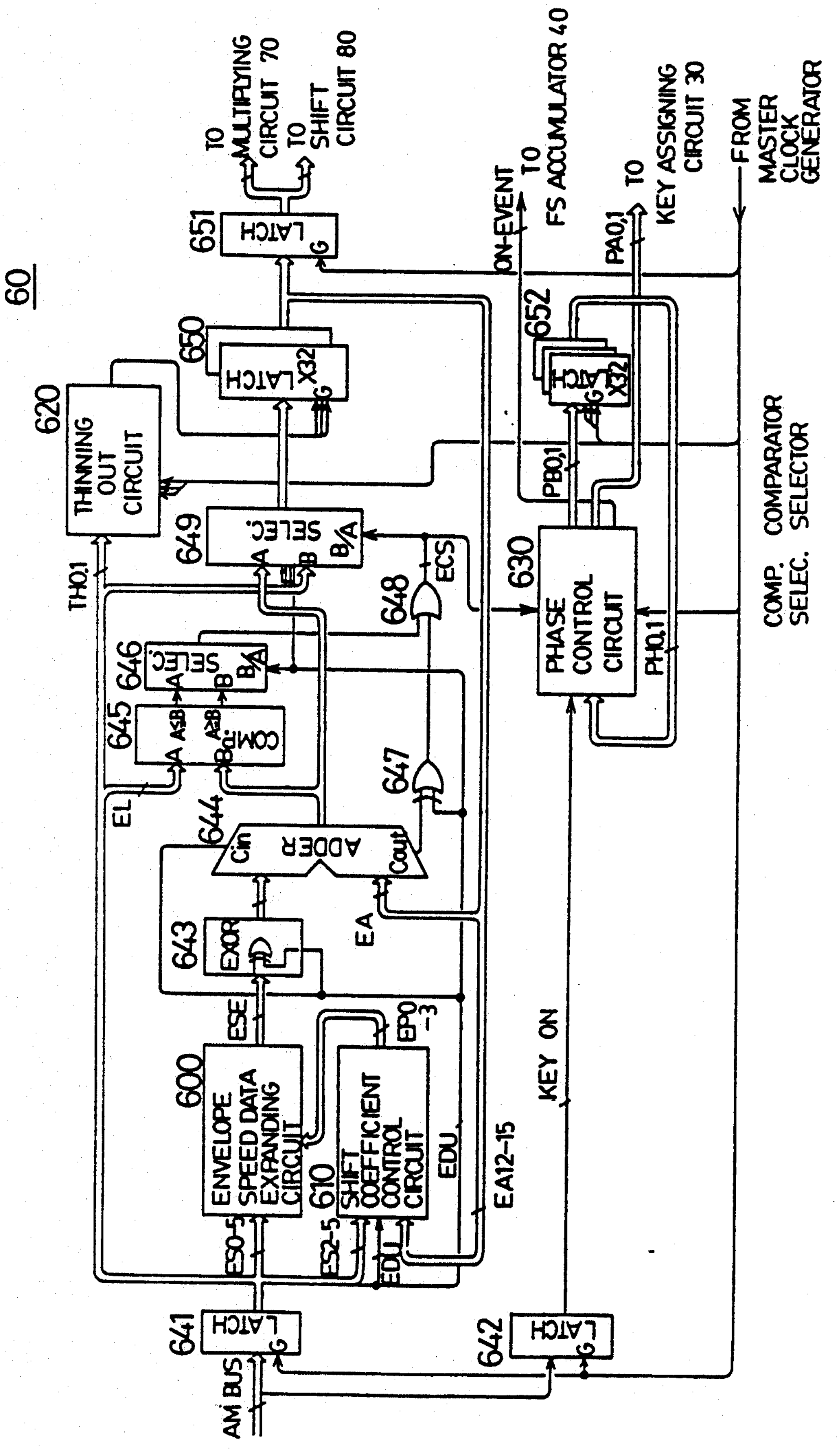
FIG. 17 is a circuit diagram showing the construction of an envelope generator 60.
Figure 22:
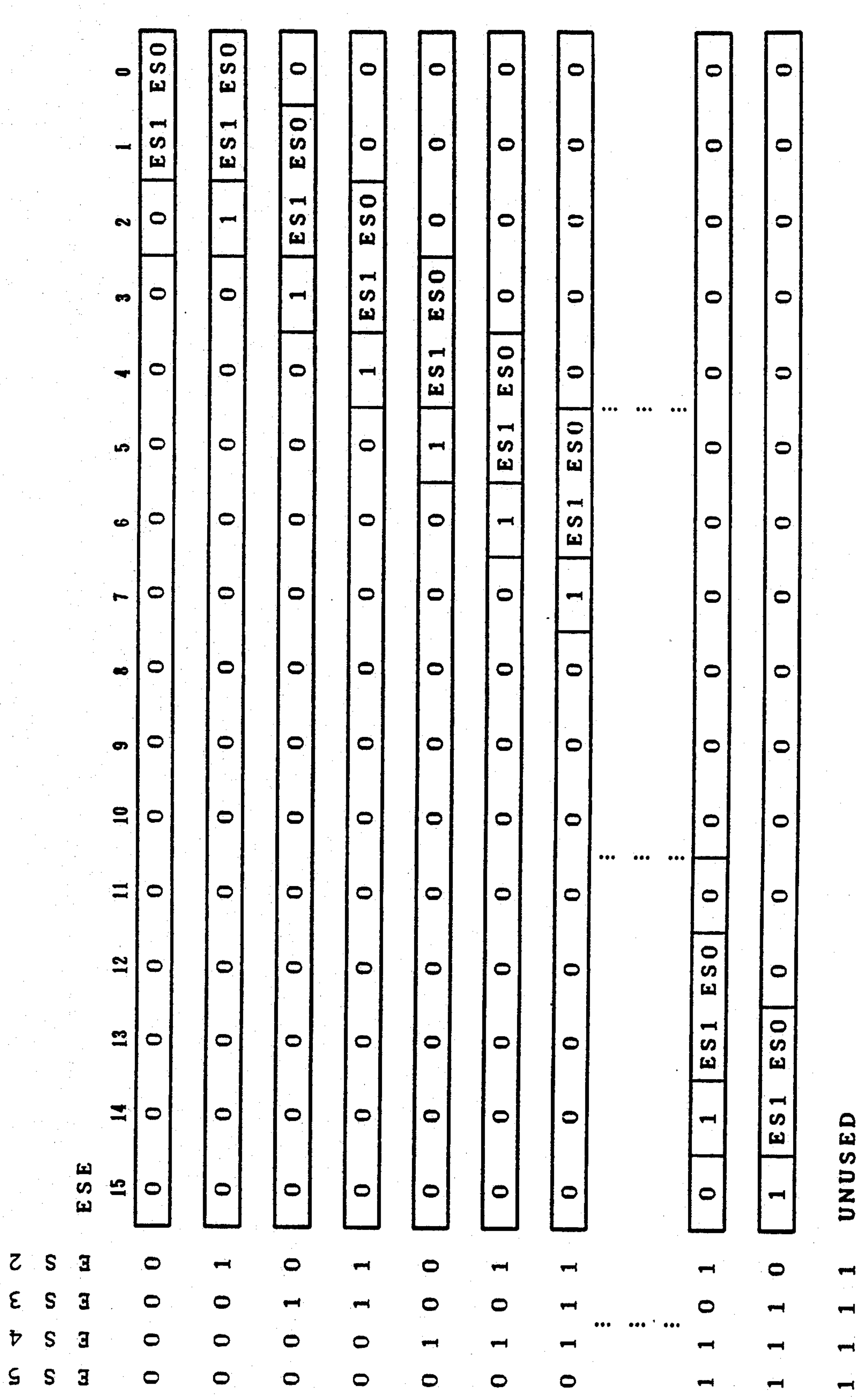
FIG. 22 is a diagram showing the contents of the expanded envelope speed data ESE.

FIG. 17 is a schematic block diagram showing the construction of the envelope generator 60. The envelope speed data ES0–5 sent from the assignment storing memory 32 is supplied through a latch 641 to the envelope speed data expanding circuit 600, whereupon the expansion of the data ES0–5 as shown in FIG. 22 is performed. The thus-expanded data ESE is sent from the circuit 600 through a group of EX-OR gates 643 to an adder 644, whereupon the data ESE is added to the accumulated envelope value EA0–15. Then an output of the adder 644 is sent through a selector 649 to a group of latches 650, and thereafter, signals of the group of the latches 650 are returned back to the adder as a signal indicating the value EA0–15 and are output through a latch 651 to the multiplying circuit 70 and the shift circuit 80.

Figure 24:
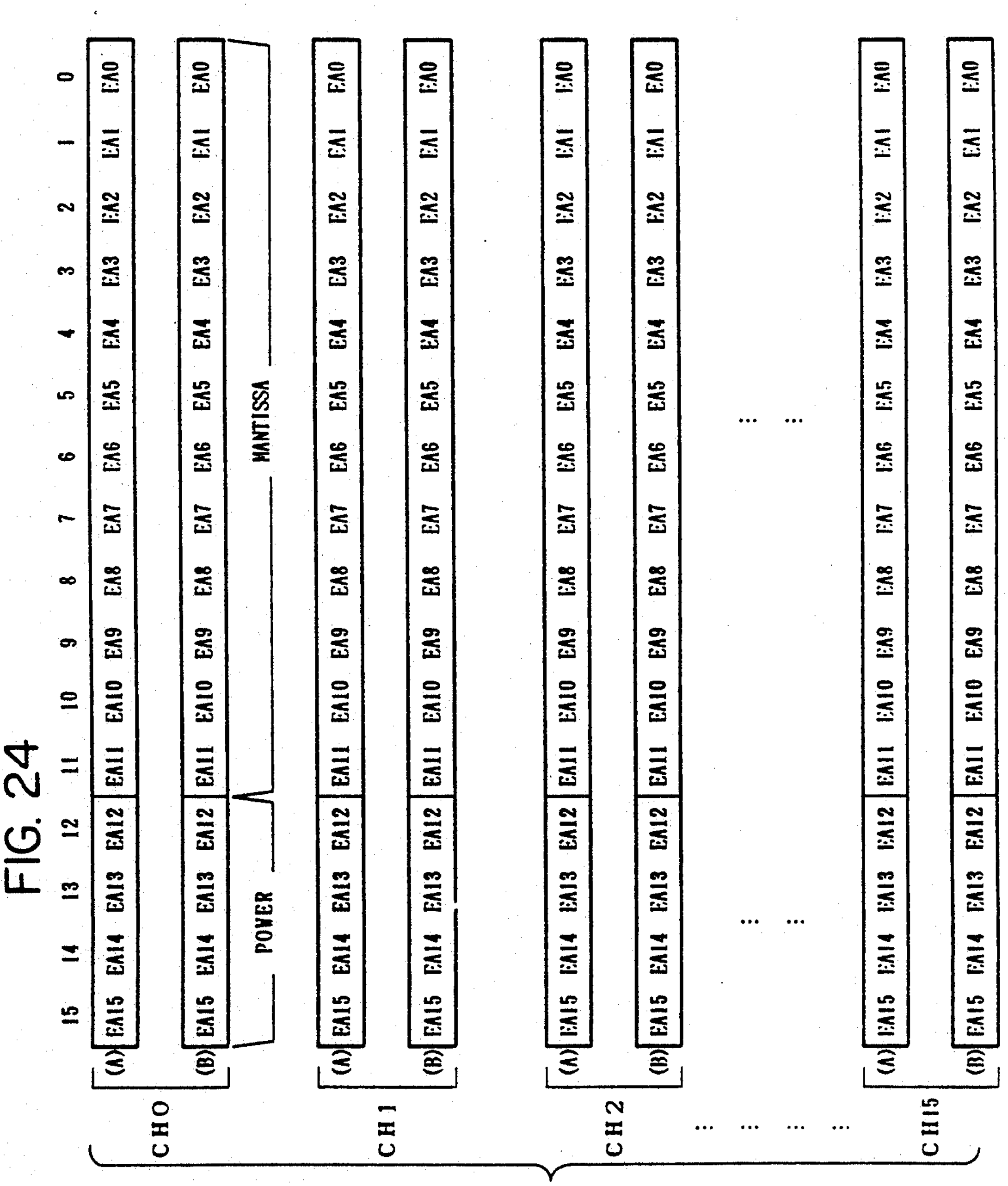
FIG. 24 is a diagram showing the contents of the accumulated envelope value EA.

The envelope add-subtract signal EDU for selecting one of the addition of the expanded envelope speed data ESE to the accumulated envelope value EA and the subtraction of the expanded envelope speed data ESE from the value EA is supplied to a group of EX-OR gates 643. When the expanded subtraction is selected, the sign of the data ESE is changed, and thereafter, the changed data ESE is supplied to an adder 644 and the subtraction of the data ESE is effected. The seven high order bits of the value EA from the adder 644 are fed to a comparator 645 and compared with the envelope level data EL of an attack phase, a decay phase, a sustain phase or a release phase, as shown in FIG. 24. If the value EA exceeds the envelope level data EL, a phase advancing signal ECS is supplied through a selector 646 and a NOR gate 648 to the selector 649. Therefore, the data obtained by adding the 9-bit data, the value of which is equal to that indicated by the signal EDU, to the data EL as lower order bits than the LSB of the data EL is newly selected as the value EA, and thus at the starting point of the next phase the value EA is modified to produce a precise value of the data EL.

The envelope add-subtract signal EDU for selecting the addition or the subtraction of the data ESE is used as a selection signal of the selector 646. If the addition is selected, the time when the value EA becomes equal to or greater than the data EL is detected, and further, if the subtraction is selected, the time when the value EA becomes equal to or less than the data EL is detected. An outpout of the adder 644 from a Cout terminal thereof and the signal EDU are input to an EX-OR gate 647. In this case, the phase advancing signal ECS is also output from the gate 648, and thus the processing advances to the next phase even if the accumulated envelope value overflows or underflows.

This transition of the phase is effected by a phase control circuit 630, and thus the phase control circuit 630 enters the attack phase in accordance with a key on signal fed from the latch 642. Thereafter, every time the phase advancing signal ECS is supplied to the phase control circuit 630, the phase of the circuit is advanced to the next phase, i.e., the decay phase, the sustain phase and the release phase, in this order. At the transition of the phase, the phase control circuit 630 instructs the assignment storing memory 32 of the key assigner 30 to read the envelope data of the next phase. Note, when maintaining a current phase, the maintenance of the current phase is effected by the group of the latches 652.

The expansion of the compressed envelope speed data ES in the envelope speed data expanding circuit 600 is effected by performing the shift control in accordance with shift coefficient data EP0–3 sent from a shift coefficient control circuit 610. This shift coefficient data EP0–3 is produced on the basis of the four high order bits ES2–5 of the envelope speed data, the four high order bits EA12–15 of the accumulated envelope value, and the envelope and subtract signal EDU.

The thinning-out data THO, 1 from the assignment storing memory 32 is fed to the thinning-out circuit 620, which controls the thinning of the times of latching of the accumulated envelope values in the group of the latches 650. The clock signals are supplied to the thinning-out circuit 620, the phase control circuit 630, the group of latches 652 and latches 641, 642 and 651, to effect the channel synchronization and the synchronization of the musical sound generating processing.

8.1. ENVELOPE SPEED DATA EXPANDING CIRCUIT 600

Figure 18:
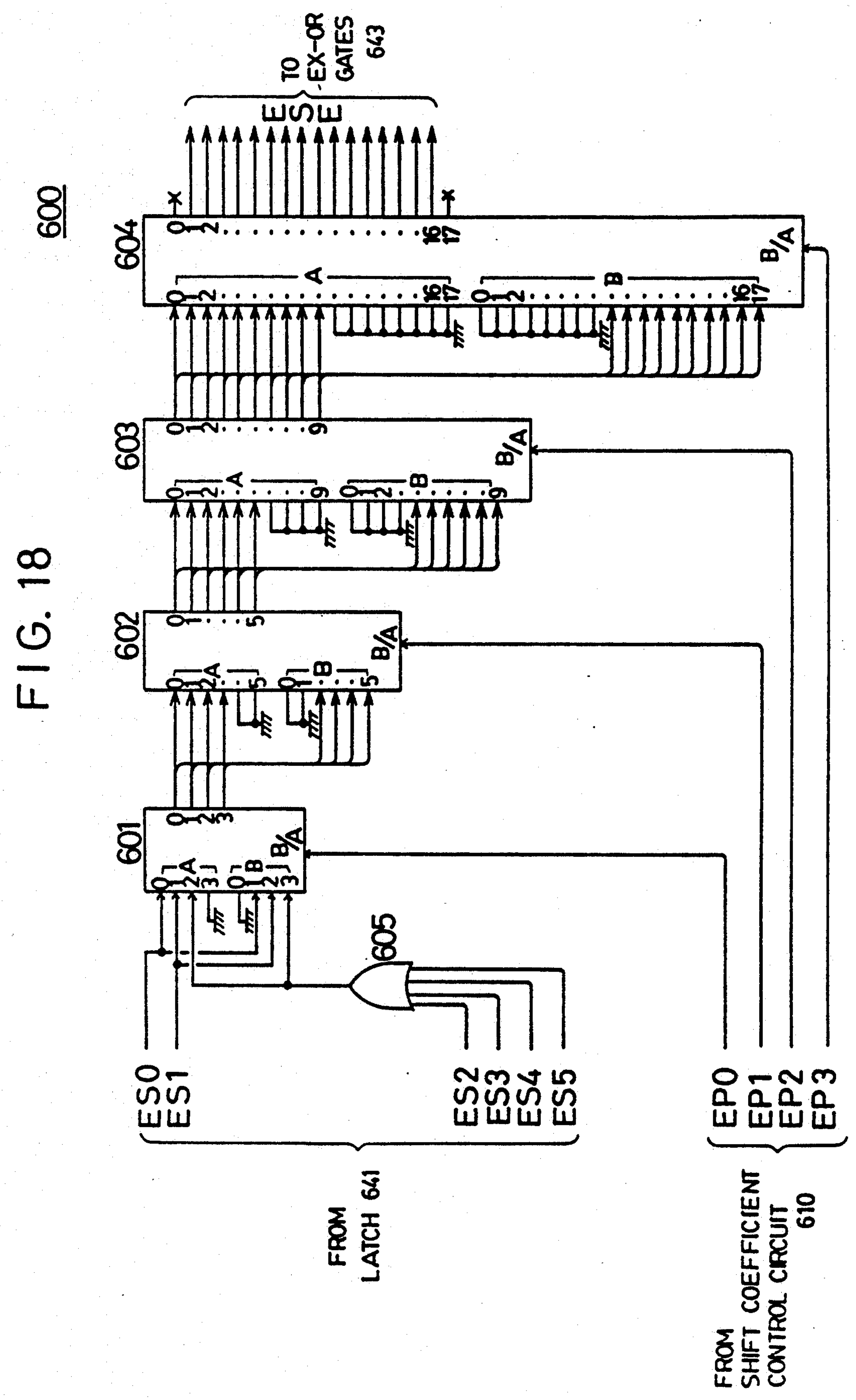
FIG. 18 is a circuit diagram showing the construction of an envelope speed data expanding circuit 600.

FIG. 18 is a circuit diagram showing the construction of the envelope speed data expanding circuit 600. The envelope speed data ES0 is input to the "0" terminal of the group A and the "1" terminal of the group B of the selector 601; the data ES1 to the "1" terminal of the group A and the "2" terminal of the group B; an output of an OR gate 605 receiving the data ES2–5 to the "2" terminal of the group A and the "3" terminal of the group B; and data "0" to the "3" terminal of the group A and the "0" terminal of the group B, thereby, the bits ES0, 1 and another bit higher than the bit ES1 by 1 of the data ES shown in FIG. 22 are generated.

Figure 23:
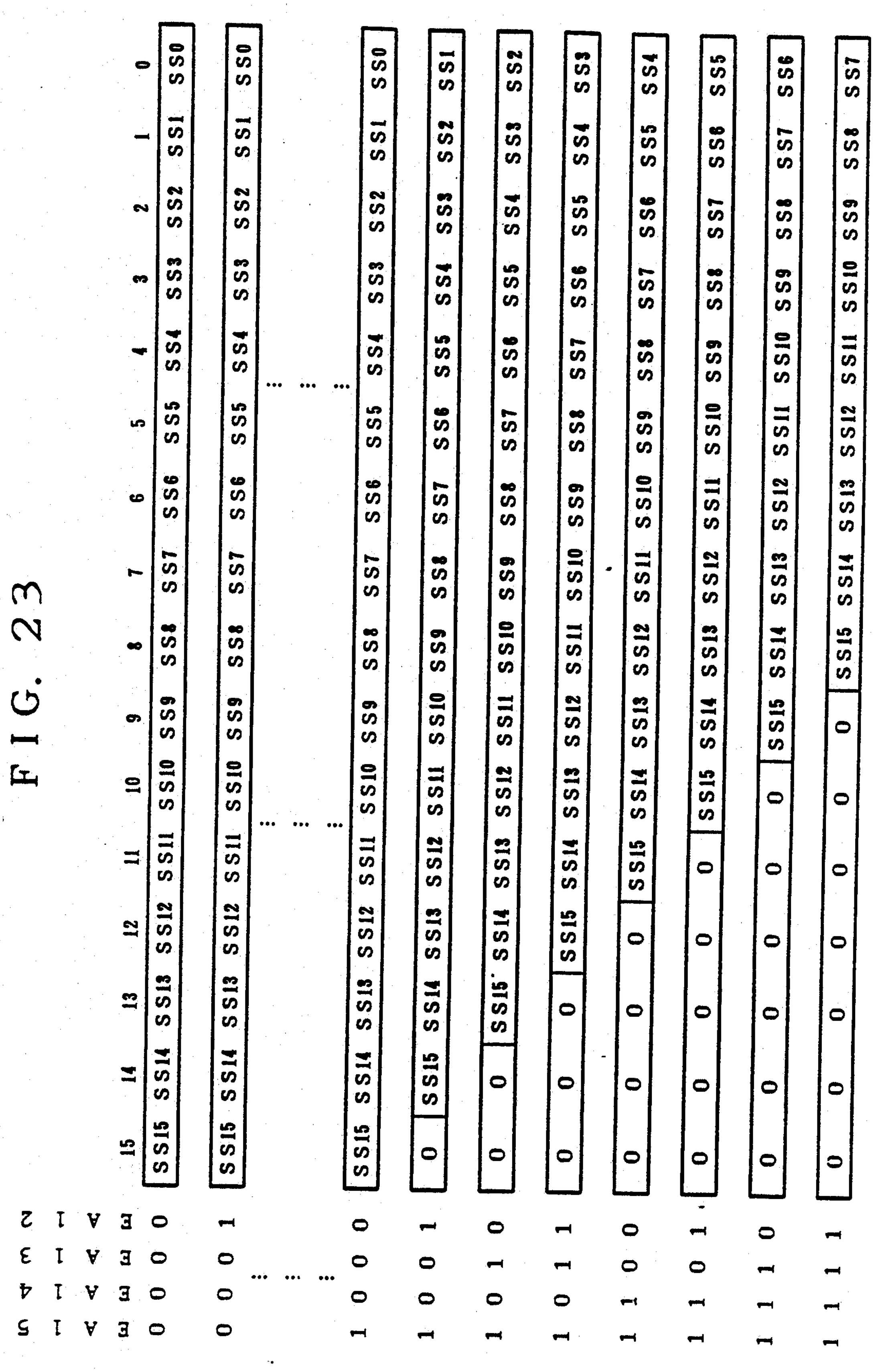
FIG. 23 is a diagram illustrating the relationship between the envelope power data EA12–15 of the accumulated envelope value EA and the envelope speed data ESE, during the attack time.

Further, 2-bit data "00", 4-bit data "0000" or 8-bit data "0000 . . . 0" is added to the four-bit data from the selector 601 through the selectors 602, 603 and 604 as higher order bits than the MSB of the four-bit data from the selector 601 or lower order bits than the LSB of the four-bit data from the selector 601. At that time, where the data is input to the group A of each of the selectors 601, 602, 603 and 604, the input data is not shifted to the left but is output without modification. Conversely, where the data is input to the group B of each of the selectors 601, 602, 603 and 604, the input data is shifted to the left in the selectors 601, 602, 603 and 604 by 1 bit, 2 bits, 4 bits and 8 bits, respectively. Accordingly, by appropriately selecting the input condition of each of the selectors 601, 602, 603 and 604 in accordance with the shift coefficient data EP0–3, the data ES can be shifted as shown in FIG. 23.

Therefore, although the compressed envelope speed data ES including the envelope add-subtract signal EDU is represented by using only 7 bits, the number of bits required to represent the data ES is increased to 16 bits by the expansion thereof, thereby reducing the memory area.

The data EA of 16 channels, which data is obtained by accumulating the thus expanded envelope speed data ESE, is latched by the group of the latches 650 with respect to each of the two musical sound components (A) and (B). Note, the value EA is represented by using 16 bits EA0–15. Further, 4 high order bits EA12–15 thereof represent the power part of the value EA; and 12 low order bits EA0–11 thereof represent a mantissa part of the value EA.

8.2. SHIFT COEFFICIENT CONTROL CIRCUIT 610

Figure 19:
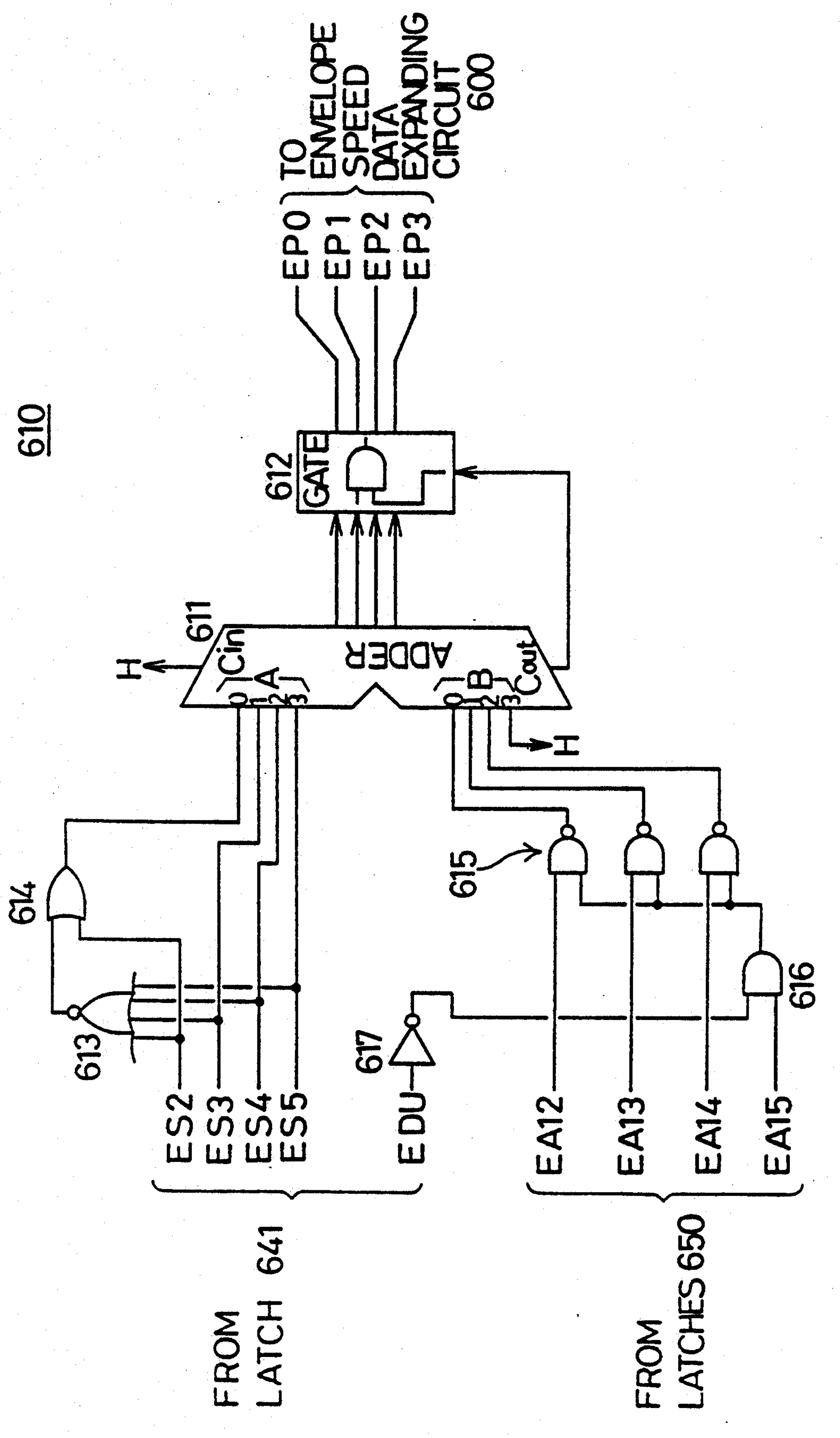
FIG. 19 is a circuit diagram showing the construction of a shift coefficient control circuit 610.

FIG. 19 is a circuit diagram showing the construction of the shift coefficient control circuit 610. Four high order bits of the compressed envelope speed data ES are input to the group A of the adder without modification and then output therefrom as the shift coefficient data EP0–3 through the group of AND gates 612, whereby the data shift as shown in FIG. 22, i.e., the expansion of the compressed envelope speed data ES, is effected. FIG. 22 illustrates the manner of the data shift when the input to the group B of the adder 611 does not affect the data shift. If an affect is felt, the manner of the data shift shown in this figure is modified. Note, when the envelope speed data ES2–5 is "0000", the shift coefficient data EP is set as "0001" by a NOR gate 613 and an OR gate 614, and thus as shown at the top of FIG. 23, even when the envelope speed data is "0000", the data shift position is the same as that where the envelope speed data is "0001".

The envelope add-subtract signal EDU for selecting the addition or the subtraction is inverted by the inverter 617 and is then supplied through an AND gate 616 to a group of NAND gates 615. Accordingly, a signal indicating "1111" is input to the group B of an adder 611 upon an attenuation in a period of time such as the decay or release time in which the signal EDU indicates "1". Further, a signal representing "1" is input at a Cin terminal of the adder 611, and as a result, the input data input at the group A of the adder 611 is not affected but output without modification. Furthermore, in the attack time in which the signal EDU indicates "0", data "1111" is input at the group B thereof and the input to the group A thereof is further output without modification when the MSB of the value EA is "0".

Conversely, when the MSB EA15 represents "1", the power data EA12-15 of the value EA is inverted and then fed to the group B of the adder 611 as a decrement.

Figure 25:
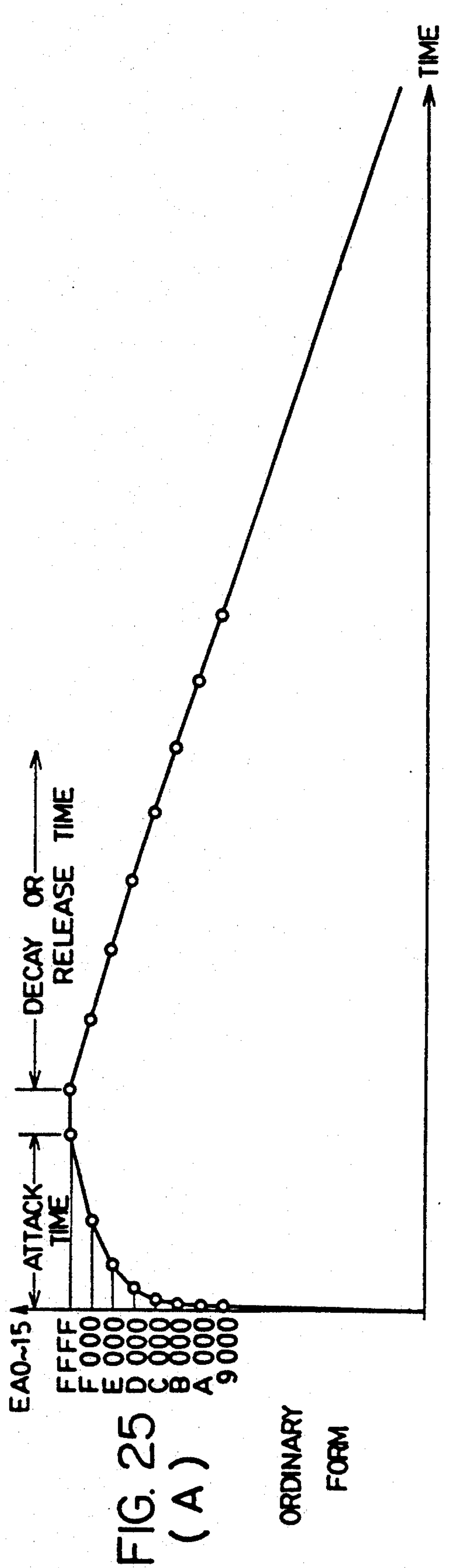
FIGS. 25A and 25B are waveform charts showing the envelope waveform in accordance with the value EA.
Figure 25:
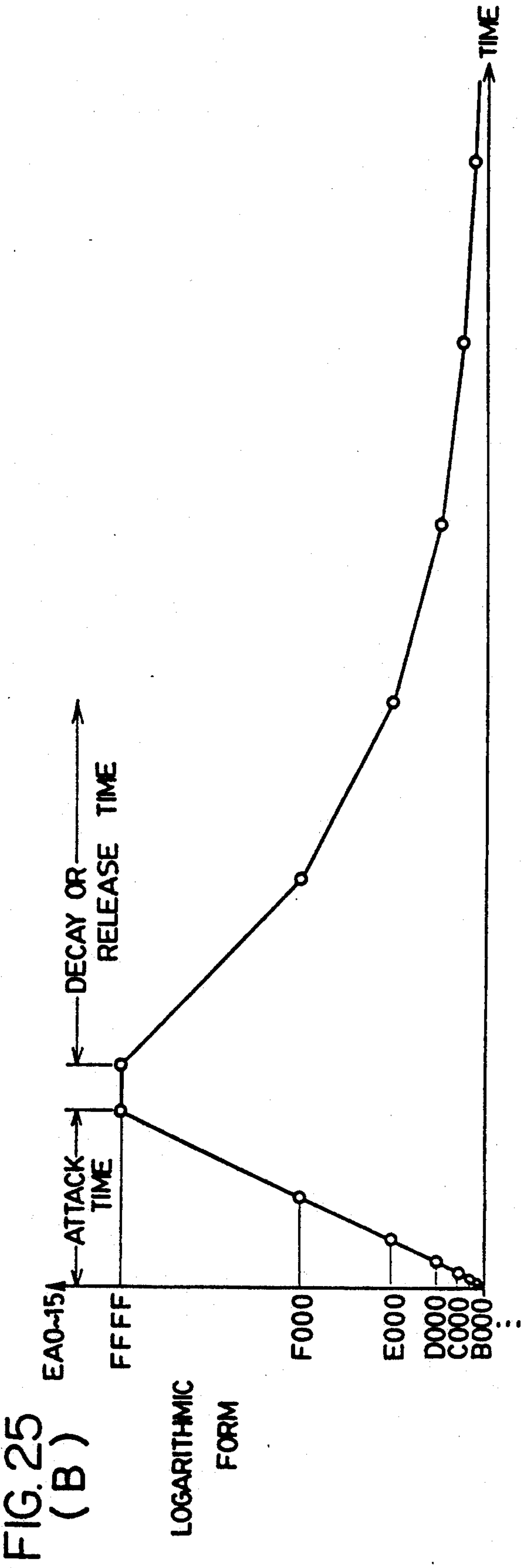

Accordingly, as the power data EA12-15 exceeds the value "1000" and further varies from "1001" (=$9_H$) to "1011" (=$B_H$) through "1010" (=$A_H$), the shift coefficient data EP0-3 is decreased from the original value in the following manner, −1, −2, −3, . . . Note, the subscript $_H$ is used to indicate a hexadecimal digit. Therefore, as shown in FIG. 23, the shifting-up (i.e., left-shift) of the data in the envelope speed data expanding circuit 600 is restrained, and the value of the speed data ES gradually decreased in the following way, ½, ¼, ⅛. . . . As a result of this, a portion of the envelope waveform corresponding to the attack time is shaped like an exponential curve as shown in FIG. 25(A), and thus the powers of the attack portion of the envelope are closer to those of natural sounds. In this case, if the data EA12-15 is equal to or less than "1000" (=$8_H$), the waveform is not shaped like an exponential curve but has a linear shape. This is because, in such a range of the data EA12-15, there is substantially no difference between the resulting sound where the portion of the envelope corresponding to the attack time has an exponential waveform and that where such a portion has a linear waveform, i.e., in practice the difference there between cannot be discriminated by the human ear or the ability to perceive sounds. Thereby, the configuration of the circuits can be simplified.

Note, a signal from the Cout terminal of the adder 611 is supplied to the group of the AND gates 612 as an enable signal. Therefore, when the decrement supplied to the group B is increased in comparison with the data ES2-5, and as a result the value of the shift coefficient data EP0-3 becomes negative, an output from the Cout terminal becomes equal to "0" and the group of AND gates 612 is disabled.

8.3. PHASE CONTROL CIRCUIT 630

Figure 20:
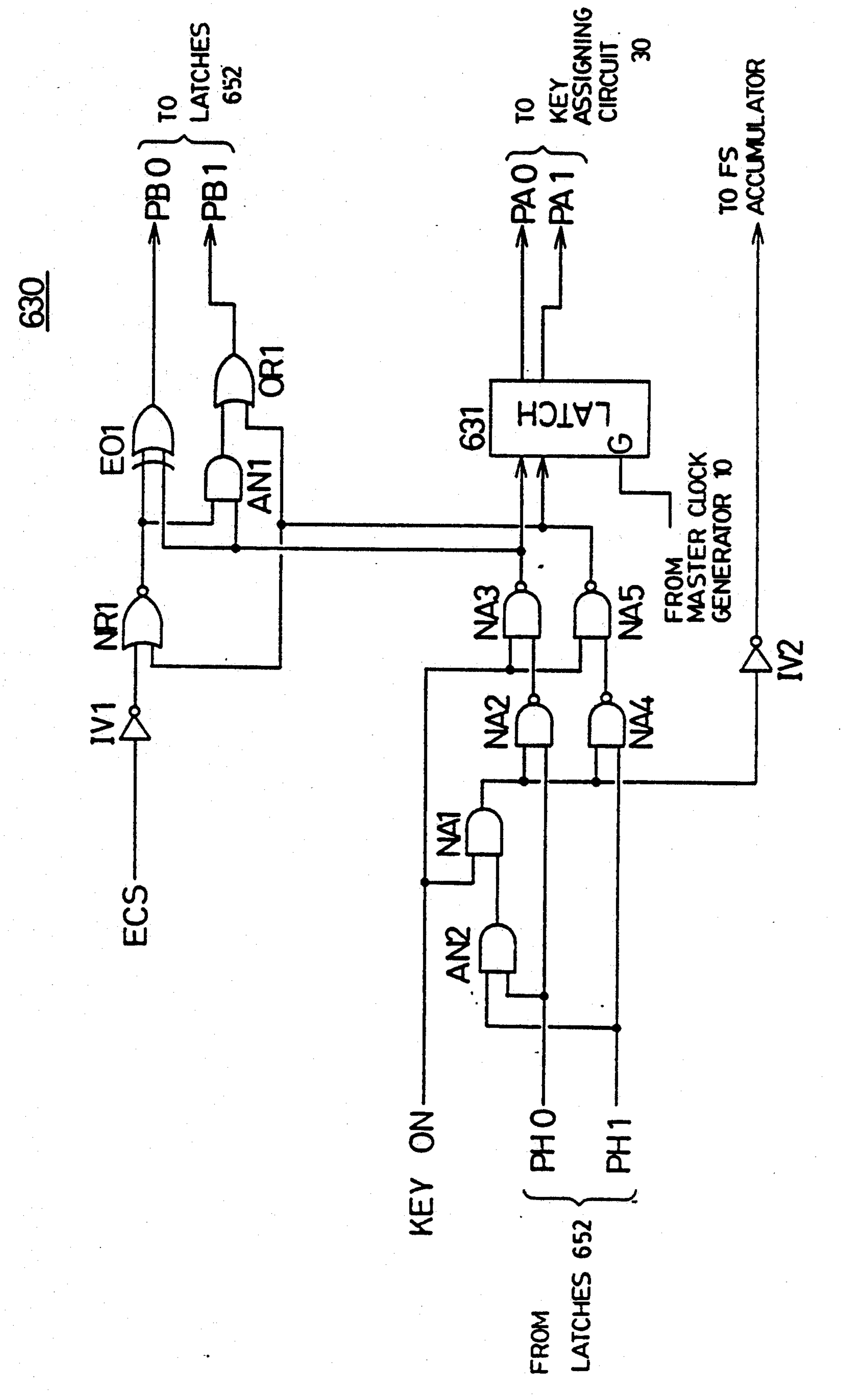
FIG. 20 is a circuit diagram showing the construction of a phase control circuit 630.

FIG. 20 is a circuit diagram showing the construction of the phase control circuit 630. Further, FIGS. 28(A) and (B) are diagrams illustrating the data conversion effected by this phase control circuit 630. First phase parameters PH0,1 are obtained by the group of the latches 652 from preliminary phase parameters PB0,1 supplied thereto. This set of the first phase parameters PH0,1 represents the attack phase where the value thereof is "00" (=$0_H$), a second attack phase or the decay phase where the value thereof is "01" (=$1_H$), the sustain phase or a second decay phase where the value thereof is "10" (=$2_H$), and the release phase or a state in which there is no sound where the value thereof is "11" (=$3_H$).

Referring to FIG. 20, where the value represented by the "key on" signal is "0", an output of NAND gates NA3,5 becomes "11" regardless of the value of the first phase parameters PH0,1. Further, the value of a set of second phase parameters PA0,1 represented by an output of a latch 631 becomes "11" (=$3_H$) as shown in FIG. 28(A). This is because the apparatus is forced into the release phase regardless of the current phase thereof if the apparatus enters a "key off" state (i.e., the key is turned off) during the radiation of the sound.

Further, where the "key on" signal indicates "1" and an output of the NAND gate NA1 is "1", the first phase parameter PH0,1 is inverted by NAND gates NA2,4 having outputs which are further inverted by NAND gates NA3,5. Further, the outputs of the NAND gates NA3,5 are maintained as shown in FIG. 28(A), because in such a case, only the current phase is maintained.

Furthermore, where the value indicated by the "key on" signal becomes "0" and that of the first phase parameters PH0,1 is "11" (=$3_H$) (i.e., in the released phase), the outputs of the NAND gates NA2,4 become "11". Therefore, outputs of the NAND gates NA3,5 become "00", and the value indicated by the second parameters PA0,1 becomes "00" (=$0_H$) as shown in the bottom of FIG. 28(A). This is intended to change the value of the second parameters to "00" to bring the apparatus to the state of generating and radiating the next musical sound. At that time, an output of an inverter 1V2 becomes "0", and an on-event signal is output. Note, the latch 631 operates to latch a signal representing the first phase parameters in synchronization with the clock signal from the master clock generator 10.

Further, when the value indicated by the phase advancing signal ECS is "0", the data output from a NOR gate NR1 to an EX-OR gate EO1 becomes "0". Also, the second phase parameter PA0 is output therefrom without modification as the preliminary phase parameter PB0, and the AND gate AN1 is disabled so that the second phase parameter PA1 is output from an OR gate OR1 as the preliminary phase parameter PB1 having a value thereof maintained as shown in FIG. 28(B). This is because it is necessary only to maintain the current phase if an advance of the phase is not instructed.

Conversely, when the phase advancing signal ECS indicates "1", the value indicated by the parameters PB0,1 becomes "01", and further, the phase is advanced to the next phase where that indicated by the parameters PA0,1 is "00", and where that indicated by the parameters PA0,1 is "01", that indicated by the parameters PB0,1 becomes "10" and the phase is also advanced to the next phase, as shown in FIG. 28(B). This is because it is only necessary to advance the phase by one stage, i.e., to the next phase if an advance of the phase is instructed.

Where, however, the signal ECS indicates "1" and the value indicated by the parameters PA0,1 is "10" or "11", the phase is not advanced and the values of the parameters are maintained as shown in the bottom of FIG. 28(B). This is because the phase is advanced in accordance with only the change of the "key on" signal, as will be explained hereinbelow. First, the transition of the phase from the second attack or decay phase (where the value indicated by the parameters PH0,1 is "10" (=$2_H$)) to the release phase (where the value indicated by the parameters PH0,1 is "11" (=$3_H$)) occurs only when the state of the apparatus is changed from "key on" to "key off". Similarly, the transition of the phase from the release phase (where the value indicated by the parameters PH0,1 is "11" (=$3_H$)) to the next attack phase (where the value indicated by the parameters PH0,1 is "00" (=$0_H$)) occurs only when the state of the apparatus is changed from "key off" to "key on".

Figure 27:
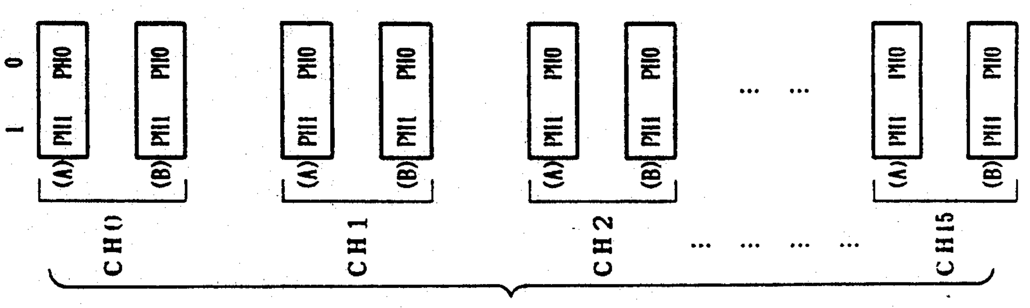
FIG. 27 is a diagram showing the contents of phase parameters PH.

FIG. 27 is a diagram illustrating the manner in which the values of the phase parameters PH0,1 (or PB0,1) are stored in the goup of latches 652. As shown in this figure, the values of the phase parameters of 16 channels CH0-15 are latched with respect to each of the musical sound components (A) and (B).

8.4. THINNING-OUT CIRCUIT 620

Figure 21:
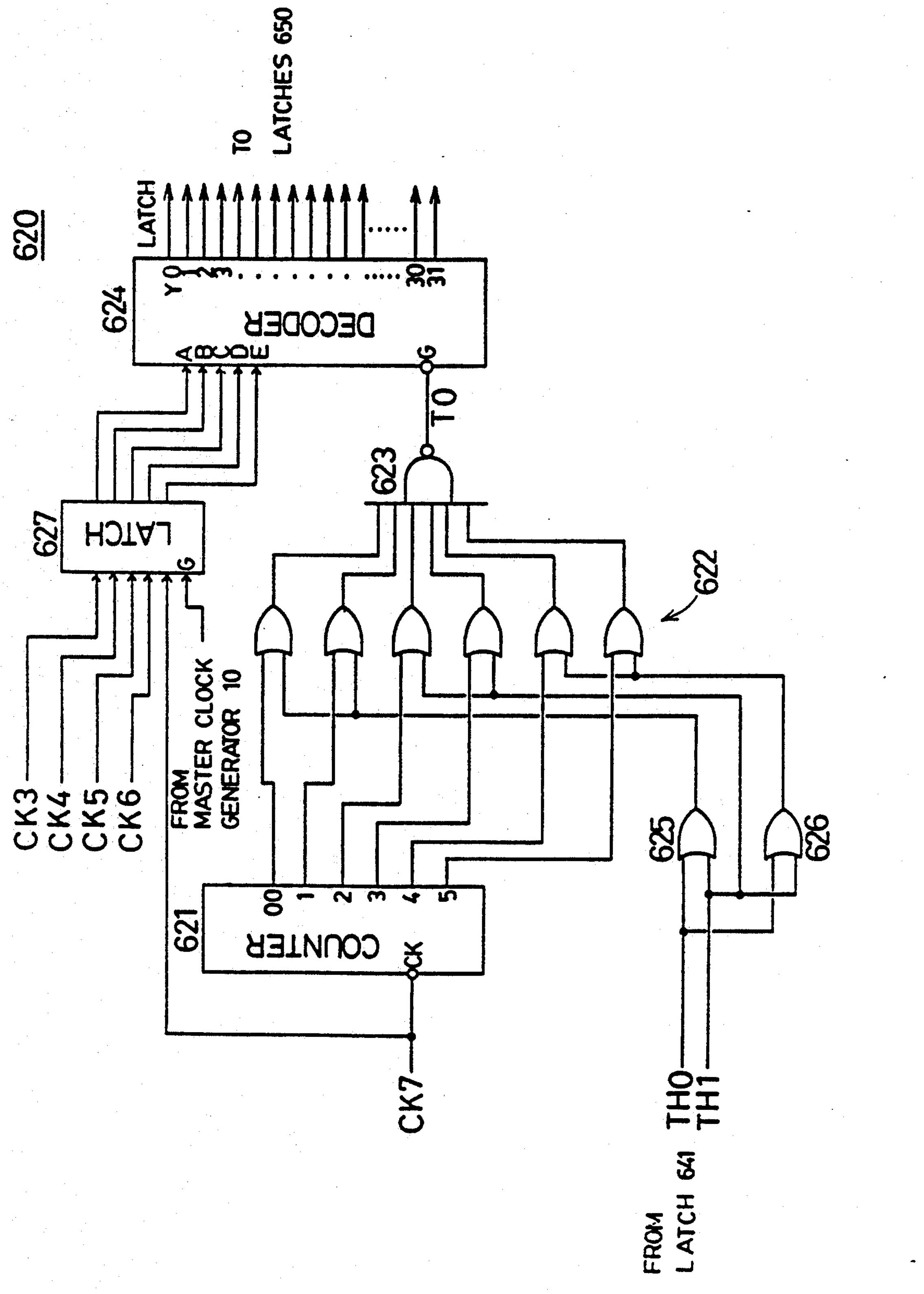
FIG. 21 is a circuit diagram showing the construction of a thinning-out circuit 620.
Figure 29:
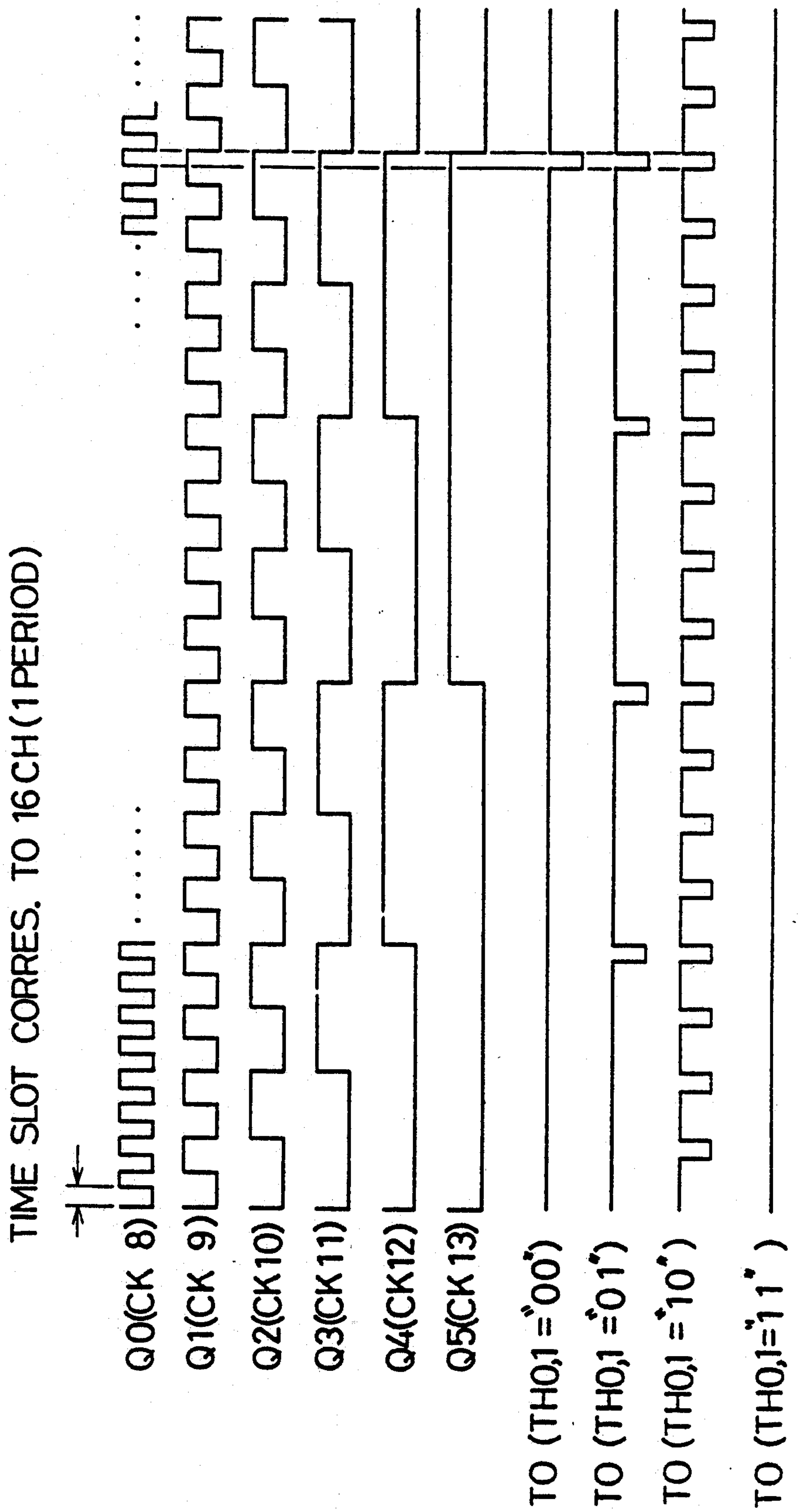
FIG. 29 is a timing chart for illustrating an operation of the thinning-out circuit 620.

FIG. 21 is a circuit diagram showing the construction of the thinning-out circuit 620. In this figure, a counter 621 receives the clock signal CK7 and outputs clock signals $Q_0$, $Q_1$, . . . $Q_5$ having periods respectively two times, four times, . . . and thirty-two times that of the clock signal CK7. These clock signals $Q_0$, $Q_1$, . . . $Q_5$ are output from a NAND gate 623 through a group of OR gates 622 as a latch signal T0. The thinning-out data TH0,1 represented by a signal sent from the assignment storing memory 32 and indicating the above described thinning-out rate, is supplied to the group of OR gates 622 through an AND gate 625 and an OR gate 626. Further, the data TH1 is also supplied to a part of the group of the OR gates 622 without change. Therefore, outputs of the OR gates each supplied with a signal indicating "1" are continuously forced to be "1", and each of the clock signals $Q_0$, $Q_1$, . . . $Q_5$ is made invalid.

Where the value indicated by the data TH0,1 is "00", all of the clock signals $Q_0$, $Q_1$, . . . $Q_5$ become valid, and thus the latch signal TO indicates "0" only when each of the clock signals $Q_0$, $Q_1$, . . . $Q_5$ indicates "1". In this case, as shown in a lower part of FIG. 29, the rate of output of the latch signal is one time per 64 times of receiving the clock signal CK7, which is received at an original latching rate.

Further, where the data TH0,1 indicates the value "01", only the clock signals $Q_{0\text{-}3}$ are valid so that the latch signal T0 indicates "0" only when the signals $Q_{0\text{-}3}$ indicate "1". Thus, as shown in the lower part of FIG. 29, the rate of output of the latch signal is one time per 16 times of receiving the clock signal CK7, which is received at the original latching rate.

Moreover, where the data TH0,1 indicate the value "10", only the clock signals $Q_{0,1}$ are valid so that the latch signal T0 indicates "0" only when the signals $Q_{0,1}$ indicate "1". Thus, as shown in the lower part of FIG. 29, the rate of output of the latch signal is one time per 4 times of receiving the clock signal CK7, which is received at the original latching rate.

Furthermore, where the data TH0,1 indicates the value "11", all of the clock signals Q0–5 are invalid so that the latch signal TO continuously indicates "0" regardless of the clock signals $Q_{0\text{-}5}$. Accordingly, as shown in the lower part of FIG. 29, the rate of output of the latch signal is the same as the rate of receiving the clock signal CK7, i.e., the original latching rate.

The thus-generated latch signal TO is output from one of 32 output lines of a decoder 624, and the thinning of the value EA is effected in a corresponding one of the latches 650. This thinning-out operation is serially effected at each of the latches 650. Further, the selection of one of the 32 output lines is carried out by using the clock signals CK3–7.

Figures 30A, 30B:
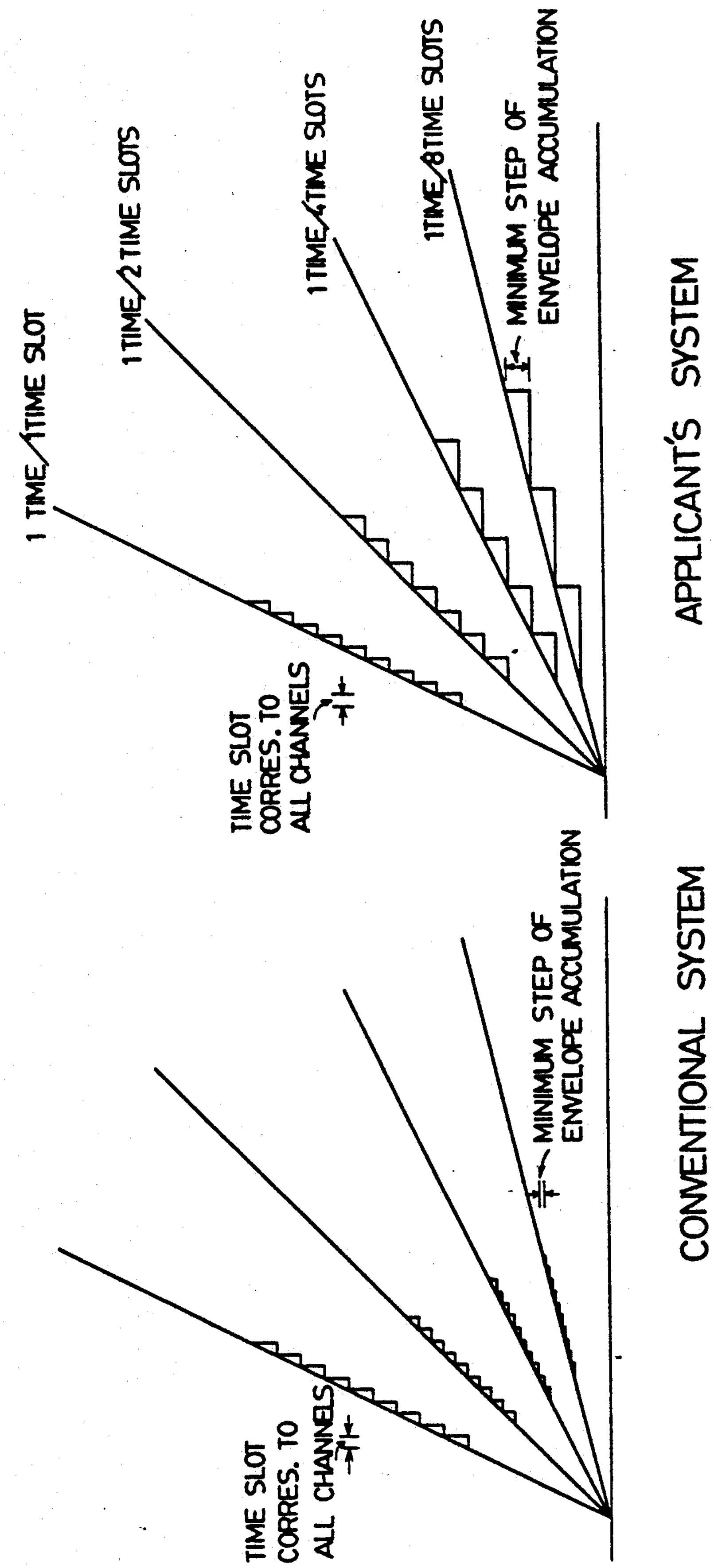
FIGS. 30A and 30B are diagrams for illustrating the effects of the thinning-out of the performance of latching operations.

Therefore, as shown in FIG. 30, by thinning out the performance of latching the values EA, the apparatus of the present invention can radiate a musical sound having a good operability.

Note, the latch 627 operates in synchronization with the clock signals sent from the master clock generator 10.

9. MULTIPLYING CIRCUIT 70

Figure 31:
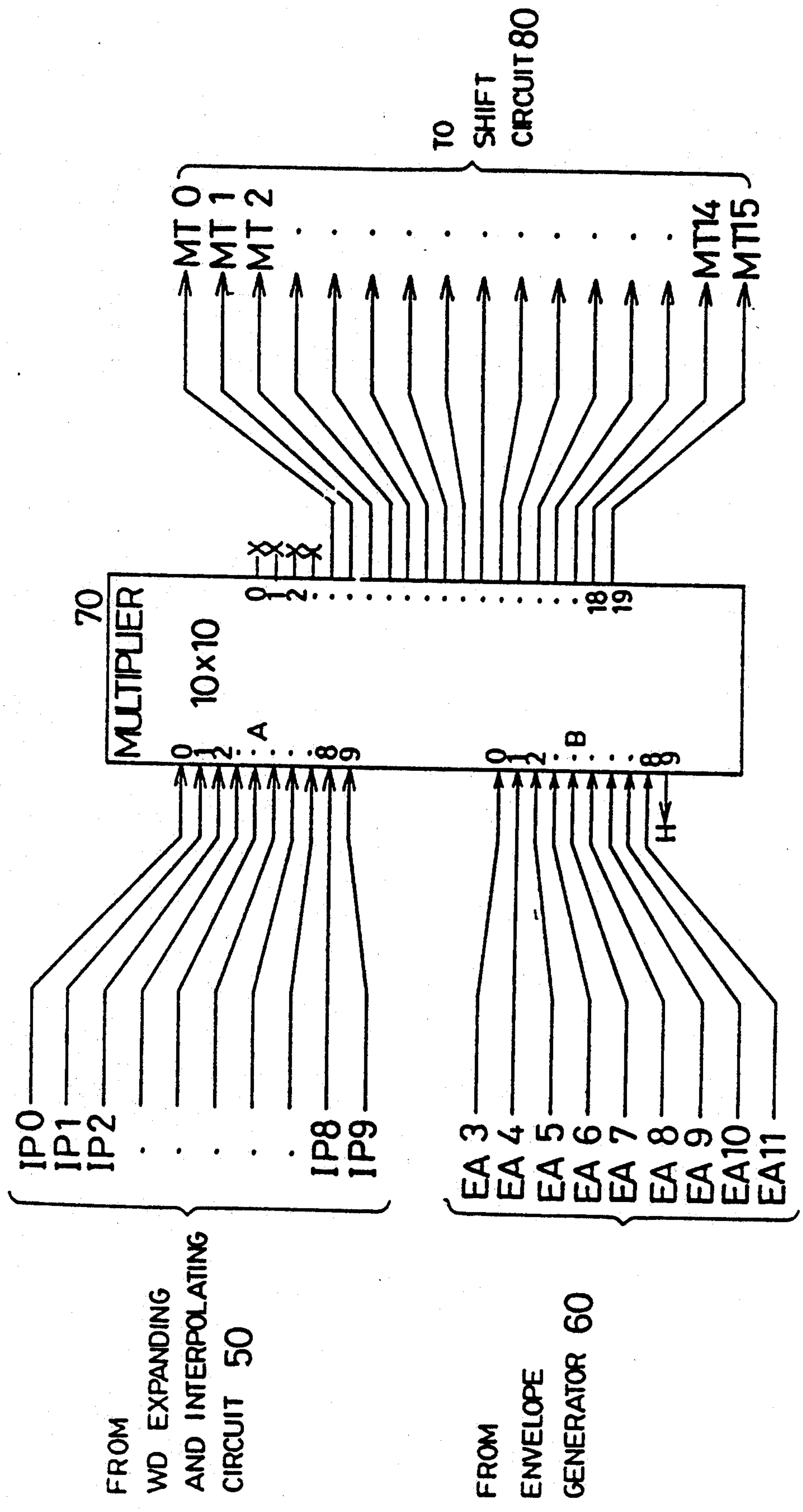
FIG. 31 is a diagram showing the construction of a multiplying circuit 70.

FIG. 31 is a circuit diagram showing the construction of the multiplying circuit (hereinafter referred to simply as the multiplier) 70. As shown in this figure, the interpolated waveform data IP0–9 composed of the sampled values of the waveform data RD and the interpolated values thereof sent from the WD expanding and interpolating circuit 50 is supplied to the multiplier 70. Further, the envelope mantissa data EA3–11 obtained by removing parts corresponding to 4 high order bits and 3 low order bits from the value EA0–15 fed from the envelope generator 60 is also supplied to the multiplier 70, whereupon the waveform data is multiplied by the envelope mantissa data.

At that time, the value "1" is added to the envelope mantissa data EA3–11 as data having a higher order than the MSB of the data EA3–11. This addition of data "1" to the mantissa data EA3–11 is equivalent to an operation given by the following equation $(1+M/2^9)$ where M denotes 9-bit data represented by the bits EA3–11 of the mantissa part of the value EA. Further, the resulting data of this operation is multiplied by the interpolated waveform data IP. The result of this multiplication is output from the multiplier 70 as data represented by using 20 bits, but as shown in this figure, 4 low order bits of this 20-bit data are truncated, and thus the data represented by using the remaining 16 bits (hereinafter referred to as the multiplication data) MTO–15 is output to the shift circuit 80.

10. SHIFT CIRCUIT 80

Figure 32:
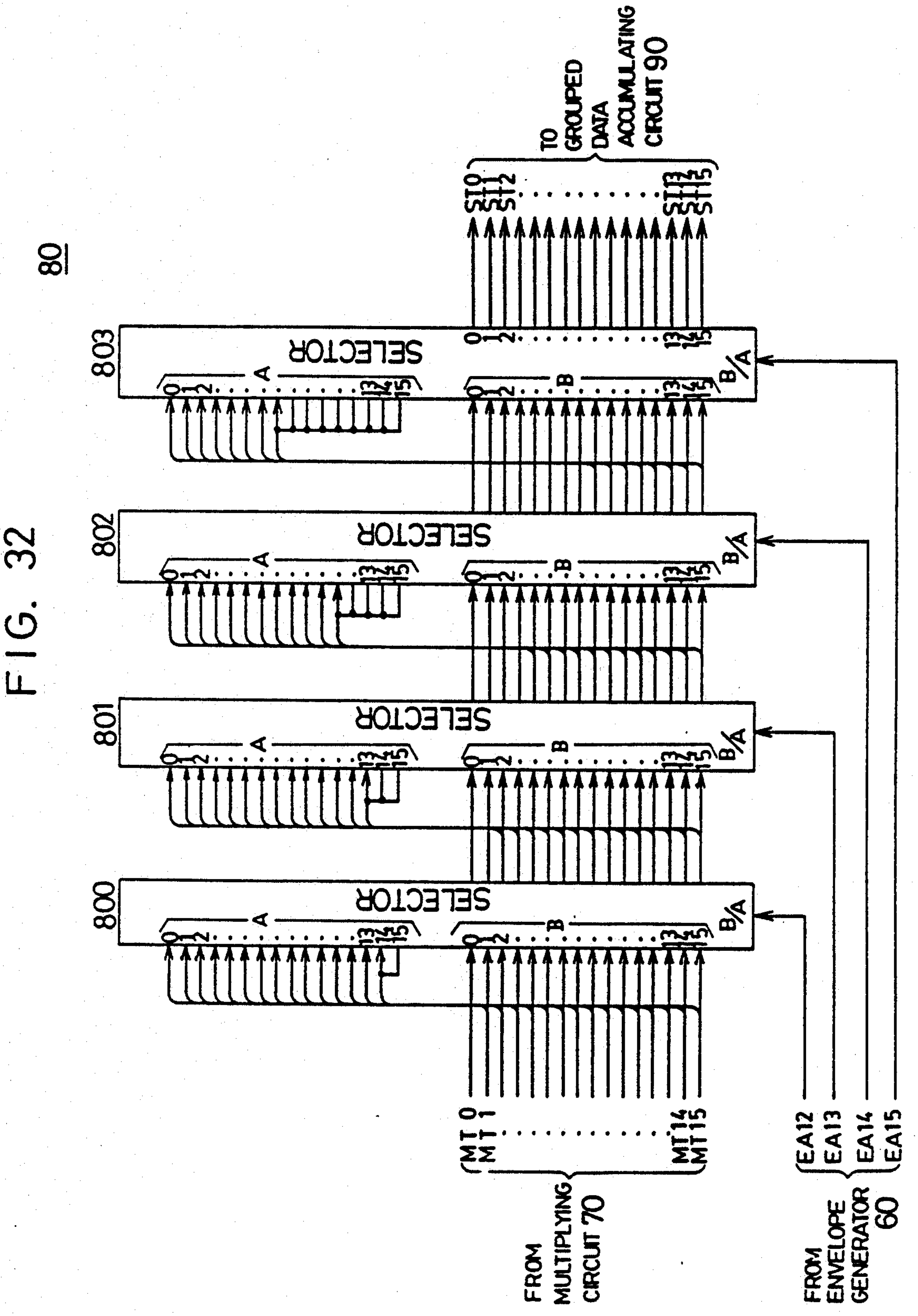
FIG. 32 is a circuit diagram showing the construction of a shift circuit 80.

FIG. 32 is a circuit diagram showing the construction of the shift circuit. The multiplication data MT0–15 are shifted to the right by four selectors 800, 801, 802, and 803, corresponding to the envelope power data EA12–15, and the result is output to the grouped data accumulating circuit 90 as the musical sound data ST0–15.

The selector 800 shifts the multiplication data MT to the right by 1 bit when the selection signal EA12 indicates "0". Conversely, when the selection signal EA12 indicates "1", the selector 800 does not shift the data MT but outputs this data to the selector 801 without modification. Next, the selector 801 shifts the data MT to the right by two bits when the signal EA13 indicates "0". When the signal EA13 indicates "1", the selector 801 outputs the data MT without modification to the selector 802. Then the selector 802 shifts the data MT to the right by four bits when the value indicated by the signal EA14 is "0". Conversely, when the signal EA14 indicates "1", the selector 802 outputs the unchanged data MT to the selector 803, and thereafter, the selector 803 shifts the data MT to the right by eight bits when the signal EA15 indicates "0", and outputs the unchanged data MT to the grouped data accumulating circuit 90 when "1" is indicated.

Accordingly, the smaller the value indicated by the envelope power data, the larger the total number of bits shifted to the right. Further, assuming P denotes the value represented by the envelope power data EA12–15, then as is understood from the foregoing description, the value $2^{P-16}$ is calculated in this shift circuit 80. Thus, assuming R denotes the interpolated waveform data, an output of this shift circuit 80 becomes $2^{P-16}\times(1+M/2^9)\times R$. In this case, the "1" in parentheses can be omitted, and if this "1" is omitted, the input to the "9" terminal of the group B of the multiplying circuit 70 is set as "0".

Figure 33A:
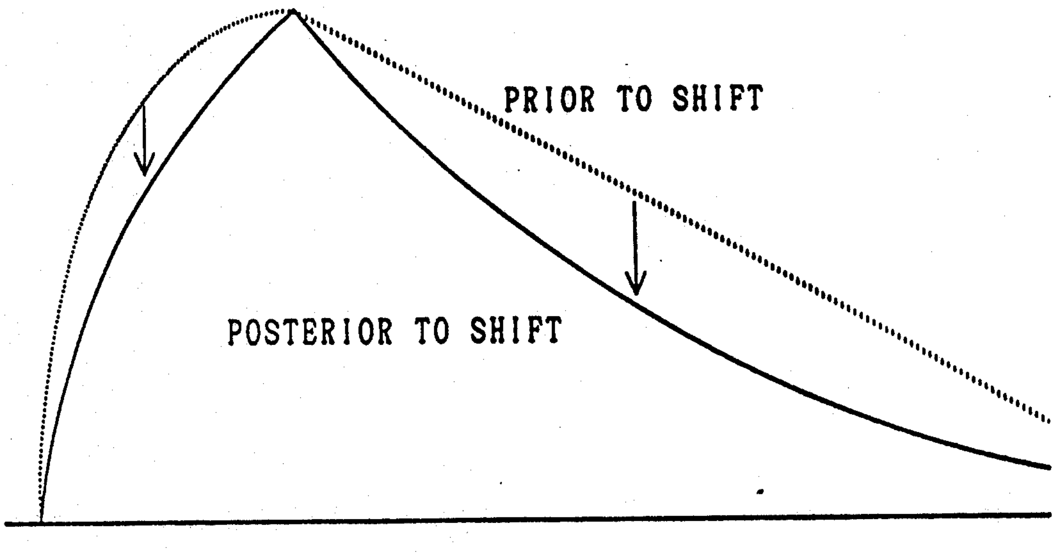
FIG. 33 is a diagram for illustrating the modification of the envelope waveform by a shift circuit 80.
Figure 33B:
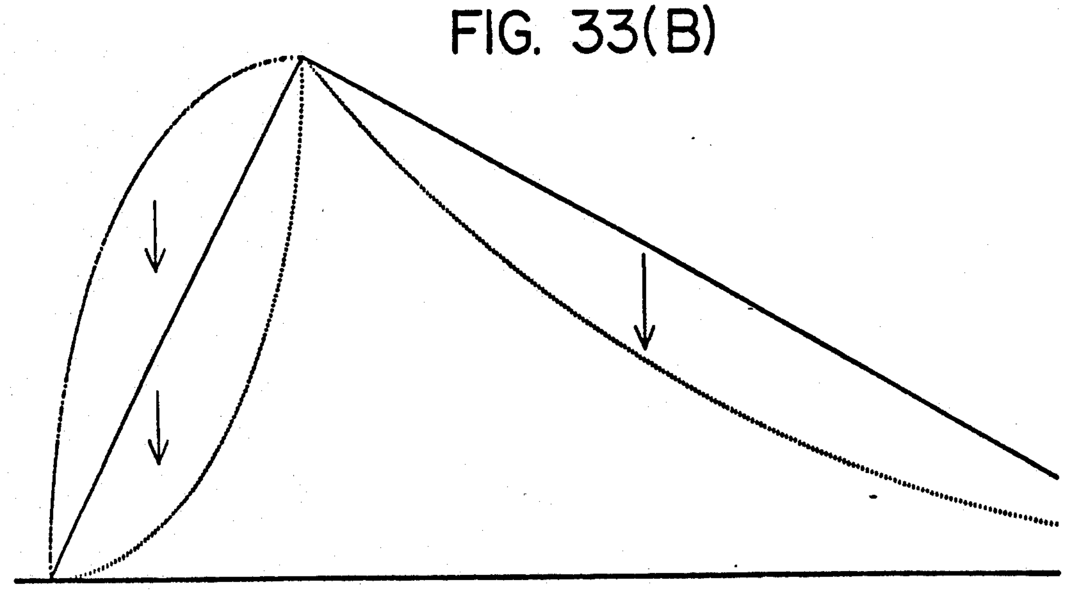

Further, the lower the level of the envelope, the larger the proportion of the reduction due to the right-shifting to the level of the envelope, and thus, by shifting the data MT to the right as described above, the attenuating portion of the envelope waveform corresponding to the decay phase or the release phase is shaped like an exponential curve as shown in FIG. 33(1), in which the portion of the envelope waveform obtained prior to the shift is shown by a one-dot chain line and the portion of the envelope waveform obtained after the shift is shown by a solid line. Thereby, the sound radiated by the apparatus of the present invention can be closer to the natural sound.

11. GROUPED DATA ACCUMULATING CIRCUIT 90

Figure 34:
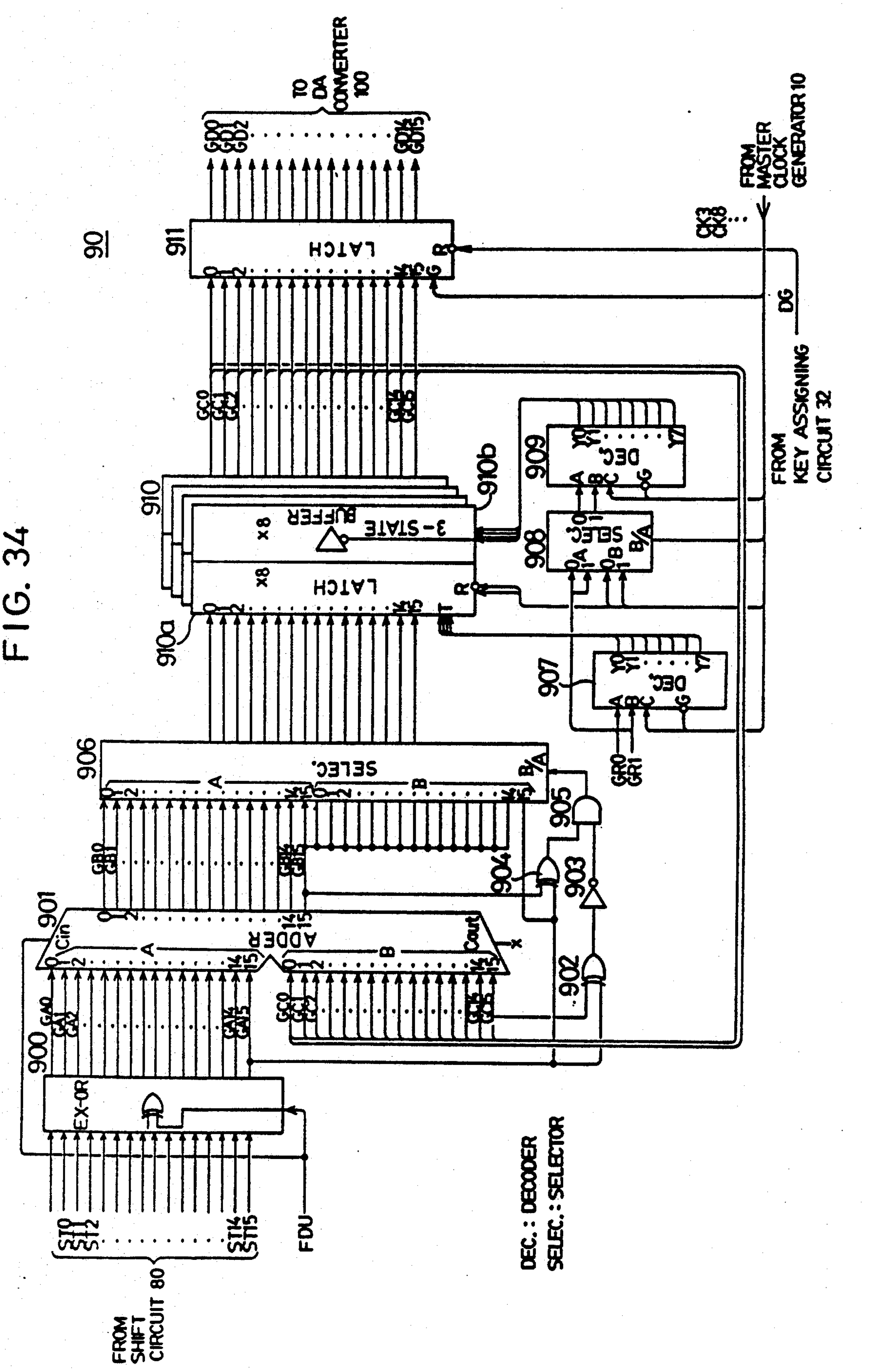
FIG. 34 is a circuit diagram showing the construction of a grouped data accumulating circuit 90.

FIG. 34 is a circuit diagram showing the construction of the grouped data accumulating circuit 90. The sign of the sound data ST0–15 from the shift circuit 80 is changed by a group of EX-OR gates 900 when the value represented by the waveform folding signal FDU, which is used to indicate that the waveform data is negative, is "1". The changed or inverted sound data GA0–15 is accumulated by an adder 901 to the current value of the accumulated sound data GC0–15 of each group, and the signals representing the result of the accumulation are supplied to the group A of a selector 906. The waveform folding signal FDU is fed to a Cin terminal of the adder 901, and when the waveform data is negative, the waveform data is corrected by being increased by 1.

Moreover, 15-bit data, each bit of which indicates the value indicated by the MSB GC15 of the data GC, is supplied to the group B of the selector 906. Furthermore, the MSB GA15 of the data GA, which has a value at a stage prior to the accumulation by the adder 901, is also fed to the group B of the selector 906 as the MSB of the bit-group B, when an overflow occurs, the maximum (positive) value "011 . . . 1" is input to the group B of the selector 906, and, conversely when an underflow occurs, the maximum (negative) value, the absolute value of which is "1000 . . . 0", is input to the group B thereof, and further the input value is output as new accumulated sound data GC from the selector 906. Note, the MSB of the input value "011 . . . 1" or "1000 . . . 0" represents the sign thereof.

This overflow or underflow is detected as follows. Namely, the MSB GA15 of the sound data GA and the MSB GC15 of the current accumulated sound data GC are output from an inverter 903 through an EX-OR gate 902. Where the data indicated by the bit GA15 matches that indicated by the bit GC15, if the value indicated by the bit GA15 is "00", it is judged that the addition has been performed. Conversely, if the value indicated by the bit GA15 is "11", it is judged that the subtraction has been performed. As a consequence, an AND gate 905 is disabled.

Next, the MSB GB15 of the accumulated sound data GB output by the adder 901 and the MSB GA15 of the data GA are input to an EX-OR gate 904. When it is detected that the data represented by the MSB GB15 and that represented by the MSB GA15 do not match, i.e., that the former data has become "1" during the addition and an overflow has occurred or that the former data has become "0" during the substraction and an underflow has occurred, a detection signal is supplied through an AND gate 905 to the selector 906 as a selection signal. Further, as described above, the maximum (positive) value "011 . . . 1" is input to the group B where an overflow occurs, or the maximum (negative) value "100 . . . 0" is input to the group B.

Accordingly, even when the accumulated value GB of the sound data overflows or underflows, the level of the amplitude of a sound signal can be maintained at the maximum level thereof. Therefore, a special decision bit can be omitted, and the quantity of data to be processed can be substantially decreased.

The data GC0–15 are input to four latch buffers 910. Each latch buffer 910 is composed of eight latches 910*a* and eight 3-state buffers 910*b* having substantially the same functions as a selector has. These eight latches are divided into two groups to be alternately switched from one to the other, i.e., a group (a) used for accumulating the musical sound data and a group (b) used for outputting the accumulated value, each of which is composed of four latches. Further, each of the four latch buffers 910 corresponds to a different one of four groups or kinds of musical sounds formed by the DA converter 100 and the sound radiating system 110. The musical sound data of each group is generated and accumulated separately.

Further, sixteen channels CH0–15 are divided into four groups each corresponding to a different one of the four groups of the musical sound data. Namely, channels CH0–3 are assigned to a first group of the musical sound data; channels CH4–7 to a second group of the musical sound data; channels CH8–11 to a third group of the musical sound data; and channels CH12–15 to a fourth group of the musical data.

Figure 35:
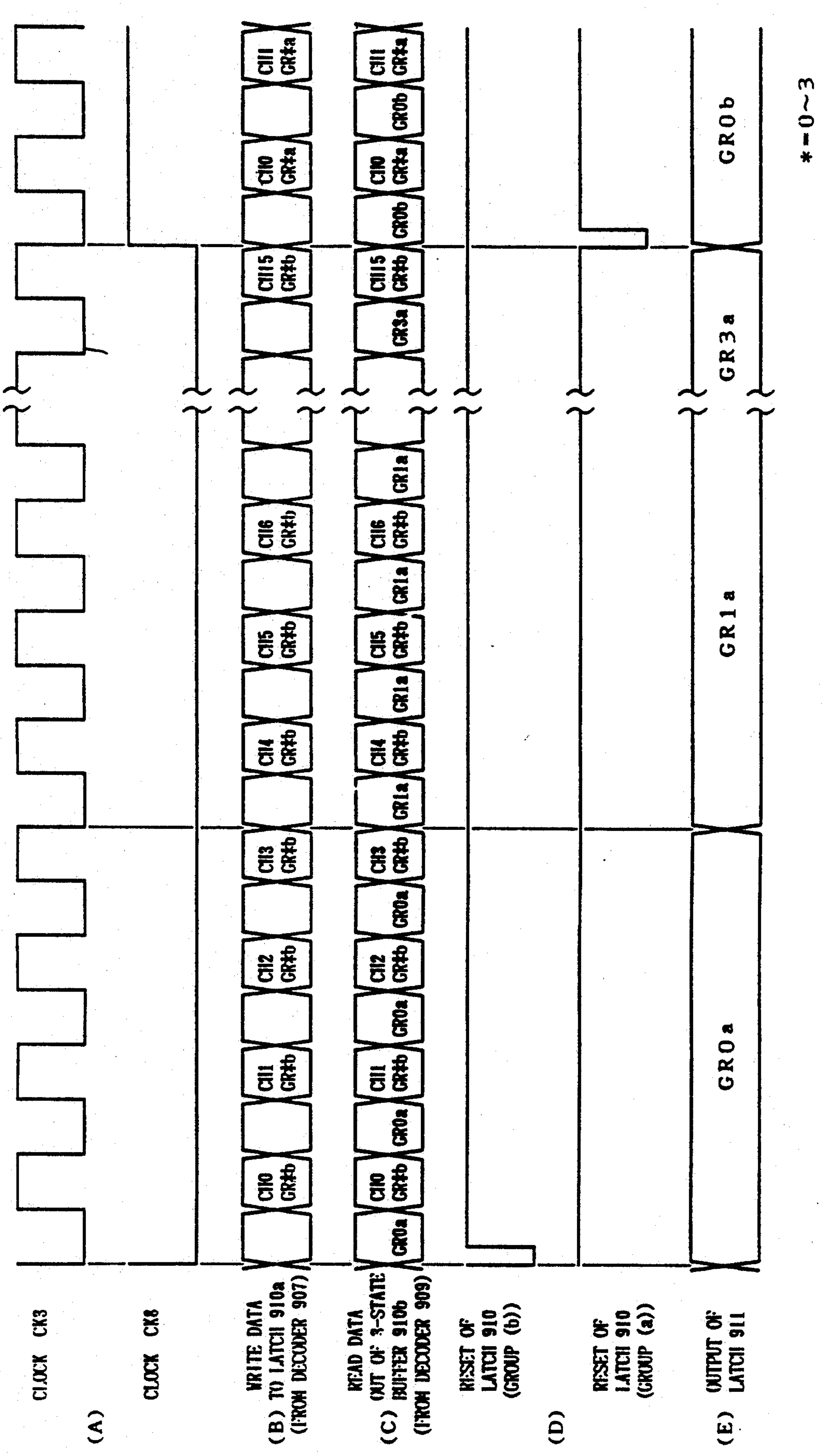
FIG. 35 is a timing chart for illustrating the operation of grouped data accumulating circuit 90 of FIG. 34.

The group of the musical sound data is indicated by a group data GR0, 1 from the assignment storing memory 32. A decoder 907 fetches the group data GR0, 1 and the clock signal CK8 every time the clock signal CK3 shown in FIG. 35 (A) is received, and decodes them to sequentially select a latch to which the accumulated value in one of the latch buffer 910 is written. FIG. 35 (B) is a timing chart illustrating how such a processing is performed every time the clock signal CK3 input to the decoder 907 rises. In this figure, the reference characters GR*a and GR*b represent the groups of musical sounds. Further, in these reference characters, the symbol * indicates the number of the group of musical sounds corresponding to the channel indicated directly over the character GR*a or GR*b and takes a value 0, 1, 2 or 3. In addition, a character a (or b) positioned immediately after the character * represents the group a (or b) of the latches 910*a* corresponding to the musical sound component (A) (or (B)).

The group data GR0, 1 is also supplied through a selector 908 to a decoder 909. Further, this decoder 909 also fetches the group data GR0, 1 and the clock signal CK8 every time the clock signal CK3 is received, and decodes them and controls the 3-state buffer to sequentially select a latch for reading the current accumulated value in one of the latch buffers 910. As shown in FIG. 35 (C), such a processing is performed in time slots indicated by only the group number GR0*a*, GR1*a*, GR2*a* . . . . Conversely, another clock signal is supplied together with the clock signal CK8 to the decoder 909 every time the clock signal CK3 rises, the decoder 909 then decodes them and controls the 3-state buffer 910*b*, and sequentially selects a latch for reading the accumulated value stored in the latch buffer 910. This processing is effected in time slots indicated by sets of the channel number CH0, CH1, . . . and the corresponding group number GR*a or GR*b, and thus the accumulation is performed in a latch only where the time of writing the accumulated value thereto is in accordance with that of reading the accumulated value therefrom. The reading of the accumulated musical sound data is effected in latches other than such a latch.

Further, the musical sound data GC from the latch buffer 910 is output through a latch 911 to the DA converter 100. Referring to FIG. 35 (C), the latching of the data GC is effected by the latch 911 in time slots indicated by using only the group numbers GR0*a*, GR1*a*, GR2*a* . . . . As shown in FIG. 35 (E), the data GS of each group is output by alternately using the latches of the group (a) and those of the group (b). Note, a pulse shown in FIG. 35 (D) is supplied from the master clock generator 10 to the latch buffers 10, whereby the latches of the group (a) and those of the group (b) are alternately reset. Furthermore, the latch 911 is reset by a DA gate signal from the key assigning circuit 30.

Although a preferred embodiment of the present invention has been described above, it should be understood that the present invention is not limited thereto and that various modifications can be made without departing from the spirit of the invention.

For example, the level value of the waveform data at a midway point (i.e., an intermediate step) interposed between two original sampled points (or steps) is not limited to an arithmetic mean value of the level values of the waveform data at the original sampled points, and may be a weighted mean value or a value obtained by converting the mean value by, for example, dividing it by two. Further, the values of the factors 1/4, 2/4, 3/4 and 4/4 used in the interpolation as shown in the rightmost column of FIG. 16 may be other appropriate values, and furthermore, the period for controlling the start and termination of generating the waveform is not limited to that required for generating the waveform of all of the 16 channels. Even further, the rate of output of the latch signal is not limited to one time per 4 times, 16 times or 64 times of receiving the clock signal CK7.

The scope of the present invention, therefore, is determined solely by the appended claims.

We claim:

1. A waveform generating system for use in an electronic musical instrument comprising:

waveform data storing means for storing only midway-step waveform data, which are averages of adjoining originally sampled successive steps of waveform data, and difference data representing respective differences between the waveform data at said originally sampled successive steps and corresponding midway-steps;

waveform data reading means for reading said midway-step waveform data and said difference data from said waveform data storing means;

calculating means for calculating the waveform data at said originally sampled successive steps using said midway-step waveform data and said difference data read by said waveform data reading means; and musical sound waveform generating means for generating a musical sound waveform from the waveform data at said originally sampled successive steps calculated by said calculating means and said midway-step waveform data read by said waveform data reading means.

2. The waveform generating system for use in an electronic musical instrument, as set forth in claim 1, said difference data being stored in said waveform data storing means as compressed data having a first valid data portion and a second portion indicating the location of said first valid data portion, said waveform data reading means expanding said difference data.

3. The waveform generating system for use in an electronic musical instrument, as set forth in claim 1, said calculating means calculating waveform data at interpolated steps between said midway-steps and said originally sampled successive steps.

4. A waveform generating system for use in an electronic musical instrument comprising:

waveform data storing means for storing only waveform data of midway steps between a top zero level step of a waveform and waveform data of originally sampled steps of successive sampling periods from said top zero level step, said top zero level step being a first step of the waveform, which level is zero;

waveform reading means for repeatedly reading said waveform data of said midway steps from said waveform data storing means;

output means for outputting said waveform data, which is read by said waveform reading means at moments staggered from moments at which the waveform data at said top zero level step and said originally sampled steps are ordinarily read out, by a period of time corresponding to half of a step; and inverting means for periodically inverting a value of said waveform data repeatedly output by said output means.

5. A waveform generating system for use in an electronic musical instrument comprising:

envelope speed data generating means for generating envelope speed data used to determine a rate of changing an envelope waveform;

envelope waveform generating means for generating accumulated envelope data by accumulating said envelope speed data and further outputting said accumulated envelope data as an envelope waveform;

synthesizing means for synthesizing synthesis data of a first portion of said accumulated envelope data and musical sound waveform data;

shifting means for shifting said synthesis data synthesized by said synthesizing means in accordance with a second portion of the accumulated envelope data; and generation controlling means for controlling the generation of said envelope speed data so that as a value indicated by said accumulated envelope data become larger, a value indicated by said envelope speed data generated by said envelope speed data generating means becomes smaller.

6. A waveform generating system for use in an electronic musical instrument comprising;

envelope speed data generating means for generating envelope speed data used to determine a rate of changing an envelope waveform;

envelope waveform generating means for generating accumulated envelope data by accumulating said envelope speed data and further outputting said accumulated envelope data as an envelope waveform;

synthesizing means for synthesizing synthesis data of a first portion of said accumulated envelope data and musical sound waveform data;

shifting means for shifting said synthesis data synthesized by said synthesizing means in accordance with a second portion of the accumulated envelope data; and generation controlling means for making said envelope speed data generating means operate when a value indicated by said accumulated envelope data increases and for making said envelope speed data generating means not operate when the value indicated by said accumulated envelope data decreases.

7. The waveform generating system for use in an electronic musical instrument, as set forth in claim 5, said envelope waveform generating means generating waveform data corresponding to an attack phase of said envelope waveform.

8. The waveform generating system for use in an electronic musical instrument, as set forth in claim 7, said waveform data corresponding to an attack phase of said envelope waveform generated by said envelope waveform generating means which has an exponential characteristic.

9. The waveform generating system for use in an electronic musical instrument, as set forth in claim 1, said midway-step waveform data being read repeatedly.

10. The waveform generating system for use in an electronic musical instrument, as set forth in claim 1, a reading speed of said waveform reading means corresponding to a user selected tone pitch.

11. The waveform generating system for use in an electronic musical instrument, as set forth in claim 4, said waveform data of said midway steps being respective averages of said waveform data at corresponding adjoining steps of said top zero level step and said originally sampled steps.

12. The waveform generating system for use in an electronic musical instrument, as set forth in claim 4, a reading speed of said waveform reading means corresponding to a user selected tone pitch.

13. The waveform generating system for use in an electronic musical instrument, as set forth in claim 4, said waveform data being read repeatedly.

14. The waveform generating system for use in an electronic musical instrument, as set forth in claim 1, wherein said waveform data reading means reads a plurality of said midway-step waveform data and said difference data according to musical sounds assigned to channels, said calculating means calculates a plurality of the waveform data according to musical sounds assigned to the channels, and said musical sound waveform generating means generates a plurality of the musical sound waveform according to musical sounds assigned to the channels.

15. The waveform generating system for use in an electronic musical instrument, as set forth in claim 4, wherein said waveform reading means reads a plurality of said waveform data according to musical sounds assigned to channels, and said output means outputs a plurality of said waveform data according to musical sounds assigned to the channels.

16. A waveform generating system for use in an electronic musical instrument comprising:

envelope speed data generating means for generating a plurality of envelope speed data used to determine a rate of changing an envelope waveform according to musical sounds assigned to channels;

envelope waveform generating means for generating a plurality of accumulated envelope data according to musical sounds assigned to the channels by accumulating said envelope speed data and further outputting said accumulated envelope data as an envelope waveform;

synthesizing means for synthesizing a plurality of synthesis data of a first portion of said accumulated envelope data and musical sound waveform data according to musical sounds assigned to the channels; and shifting means for shifting the plurality of said synthesis data synthesized by said synthesizing means in accordance with a second portion of the accumulated envelope data according to musical sounds assigned to the channels.

* * * * *